US012087788B2

United States Patent
Lee et al.

(10) Patent No.: US 12,087,788 B2
(45) Date of Patent: Sep. 10, 2024

(54) FINGERPRINT SENSOR, METHOD FOR MANUFACTURING THE SAME, AND DISPLAY DEVICE INCLUDING THE SAME

(71) Applicant: SAMSUNG DISPLAY CO., LTD., Yongin-si (KR)

(72) Inventors: Ki June Lee, Yongin-si (KR); Ji Hye Kim, Asan-si (KR); Jung Ha Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 84 days.

(21) Appl. No.: 17/172,440

(22) Filed: Feb. 10, 2021

(65) Prior Publication Data
US 2021/0399025 A1 Dec. 23, 2021

(30) Foreign Application Priority Data

Jun. 17, 2020 (KR) ........................ 10-2020-0073617

(51) Int. Cl.
*H01L 27/146* (2006.01)
*G06V 40/13* (2022.01)
*H01L 25/18* (2023.01)

(52) U.S. Cl.
CPC ...... *H01L 27/1461* (2013.01); *G06V 40/1318* (2022.01); *H01L 25/18* (2013.01);
(Continued)

(58) Field of Classification Search
CPC ................. H01L 27/1461; H01L 25/18; H01L 27/14612; H01L 27/14678; G06V 40/1318
See application file for complete search history.

(56) References Cited

U.S. PATENT DOCUMENTS

2004/0079941 A1* 4/2004 Yamazaki ......... H01L 29/78603
257/E29.295
2004/0263069 A1* 12/2004 Yamazaki ......... H01L 27/14678
313/506
(Continued)

FOREIGN PATENT DOCUMENTS

KR 10-2010-0061393 6/2010
KR 10-2018-0036341 4/2018
KR 10-2018-0060769 6/2018

OTHER PUBLICATIONS

Office Action issued in corresponding Korean Application No. KR 10-2020-0073617 on Apr. 1, 2024.

*Primary Examiner* — Jarrett J Stark
(74) *Attorney, Agent, or Firm* — F. CHAU & ASSOCIATES, LLC

(57) ABSTRACT

A fingerprint sensor includes: a thin film transistor disposed on a substrate; a first insulating layer disposed on the thin film transistor; a first sensing electrode disposed on the first insulating layer and connected to the thin film transistor; a second insulating layer disposed on the first sensing electrode and including an opening exposing the first sensing electrode; a sensing semiconductor layer disposed in the opening of the second insulating layer and on the first sensing electrode, and including an N-type semiconductor layer, an I-type semiconductor layer, and a P-type semiconductor layer, and a second sensing electrode disposed on the sensing semiconductor layer. An upper surface of the sensing semiconductor layer and an upper surface of the second insulating layer are coplanar.

7 Claims, 22 Drawing Sheets

(52) U.S. Cl.
CPC .... *H01L 27/14612* (2013.01); *H01L 27/1463* (2013.01); *H01L 27/14692* (2013.01); *H01L 27/14625* (2013.01); *H01L 27/14636* (2013.01)

(56) References Cited

U.S. PATENT DOCUMENTS

| | | | |
|---|---|---|---|
| 2010/0134735 A1* | 6/2010 | Nakamura | H01L 31/1055 257/53 |
| 2011/0297936 A1* | 12/2011 | Makita | H01L 27/14632 257/53 |
| 2014/0331875 A1* | 11/2014 | Frye | G01B 9/02 101/170 |
| 2017/0018588 A1* | 1/2017 | Karim | H01L 51/00 |
| 2017/0078513 A1* | 3/2017 | Chang | H01L 27/307 |
| 2017/0206395 A1* | 7/2017 | Chang | G06V 40/1318 |
| 2018/0019288 A1* | 1/2018 | Yang | H01L 31/153 |
| 2018/0226266 A1* | 8/2018 | Miyamoto | H01L 27/1225 |
| 2019/0180074 A1* | 6/2019 | Ding | G06V 40/1318 |
| 2019/0198558 A1* | 6/2019 | Jeon | H01L 27/1462 |
| 2019/0243497 A1* | 8/2019 | Zhang | H01L 27/1251 |
| 2019/0371865 A1* | 12/2019 | Lee | H10K 59/122 |
| 2020/0081139 A1* | 3/2020 | Li | G02F 1/167 |
| 2020/0091253 A1* | 3/2020 | Liu | H01L 27/3225 |
| 2020/0161402 A1* | 5/2020 | Wang | H01L 29/78633 |
| 2020/0251537 A1* | 8/2020 | Wang | H01L 51/56 |
| 2020/0259034 A1* | 8/2020 | Huang | H01L 31/105 |
| 2020/0274004 A1* | 8/2020 | Chang | H01L 27/14623 |
| 2021/0029318 A1* | 1/2021 | Son | H04N 5/36965 |
| 2021/0233467 A1* | 7/2021 | Liu | G09G 3/3233 |
| 2021/0334504 A1* | 10/2021 | Lu | H10K 59/38 |
| 2022/0037405 A1* | 2/2022 | Ren | H01L 27/288 |

* cited by examiner

FINGERPRINT SENSOR, METHOD FOR MANUFACTURING THE SAME, AND DISPLAY DEVICE INCLUDING THE SAME

CROSS-REFERENCE TO RELATED APPLICATION

This application claims priority under 35 U.S.C. § 119 to Korean Patent Application No, 10-2020-0073617 filed on Jun. 17, 2020 in the Korean Intellectual Property Office, the disclosure of which is incorporated by reference herein in its entirety.

TECHNICAL FIELD

The present inventive concept relates to a fingerprint sensor, a method for manufacturing the same, and a display device including the same.

DISCUSSION OF THE RELATED ART

A display device may be incorporated into various electronic devices such as smartphones, tablets, notebook computers, monitors, TVs, and the like. Recently, due to the development of the mobile communication technology, the use of portable electronic devices such as smartphones, tablets, and notebook computers, and the like has increased. Privacy information such as contact lists, call history, messages, photos, notes, user's web surfing information, location information, and financial information may be stored in the portable electronic devices. Therefore, to protect the privacy information of the portable electronic devices, fingerprint authentication for authenticating a fingerprint, which is the user's biometric information, may be used. In this case, the display device may include a fingerprint sensor for fingerprint authentication.

The fingerprint sensor can be implemented as, for example, an optical sensor, an ultrasonic sensor, a capacitive sensor, or the like. Typically, an optical fingerprint sensor may include a photosensitive layer and an optical layer. The photosensitive layer may include a photosensitive element that senses light, and the optical layer may provide light to the photosensitive element while minimizing noise light.

SUMMARY

According to an exemplary embodiment of the present invention, a fingerprint sensor includes: a thin film transistor disposed on a substrate; a first insulating layer disposed on the thin film transistor; a first sensing electrode disposed on the first insulating layer and connected to the thin film transistor; a second insulating layer disposed on the first sensing electrode and including an opening exposing the first sensing electrode; a sensing semiconductor layer disposed in the opening of the second insulating layer and on the first sensing electrode, and including an N-type semiconductor layer, an I-type semiconductor layer, and a P-type semiconductor layer; and a second sensing electrode disposed on the sensing semiconductor layer. An upper surface of the sensing semiconductor layer and an upper surface of the second insulating layer are coplanar.

In an exemplary embodiment of the present invention, a width of the opening gradually decreases as it approaches the substrate.

In an exemplary embodiment of the present invention, a width of the opening gradually increases as it approaches the substrate.

In an exemplary embodiment of the present invention, the I-type semiconductor layer is disposed on the N-type semiconductor layer, and the P-type semiconductor layer is disposed on the I-type semiconductor layer.

In an exemplary embodiment of the present invention, an upper surface of the P-type semiconductor layer and the upper surface of the second insulating layer are coplanar.

In an exemplary embodiment of the present invention, the second sensing electrode protrudes in a direction away from the substrate from the upper surface of the second insulating layer.

In an exemplary embodiment of the present invention, a bottom surface of the second sensing electrode and the upper surface of the second insulating layer are coplanar.

In an exemplary embodiment of the present invention, a width of the second sensing electrode is substantially the same as that of the P-type semiconductor layer.

According to an exemplary embodiment of the present invention, a method for manufacturing a fingerprint sensor including: forming a thin film transistor and a first sensing electrode on a substrate; forming a second insulating layer on the first sensing electrode, wherein the second insulating layer includes an opening exposing the first sensing electrode; stacking an N-type semiconductor material layer, an I-type semiconductor material layer, and a P-type semiconductor material layer in the opening on the first sensing electrode; performing a surface polishing on the N-type semiconductor material layer, the I-type semiconductor material layer, and the P-type semiconductor material layer to form a sensing semiconductor layer including an N-type semiconductor layer, an I-type semiconductor layer, and a P-type semiconductor layer; and forming a second sensing electrode on the sensing semiconductor layer.

In an exemplary embodiment of the present invention, an upper surface of the P-type semiconductor layer and an upper surface of the second insulating layer are coplanar, and a bottom surface of the second sensing electrode and the upper surface of the second insulating layer are coplanar.

In an exemplary embodiment of the present invention, an upper surface of the P-type semiconductor layer is disposed closer to the substrate compared to an upper surface of the second insulating layer, and a bottom surface of the second sensing electrode is disposed closer to the substrate compared to the upper surface of the second insulating layer.

In an exemplary embodiment of the present invention, a width of the second sensing electrode is greater than that of the P-type semiconductor layer.

In an exemplary embodiment of the present invention, the surface polishing includes polishing the surfaces of the N-type semiconductor material layer, the I-type semiconductor material layer, and the P-type semiconductor material layer by applying polishing slurry on the substrate and using a polishing device including a polishing pad.

In an exemplary embodiment of the present invention, the N-type semiconductor material layer, the I-type semiconductor material layer, and the P-type semiconductor material layer stacked on an upper surface of the second insulating layer are polished and removed by the surface polishing.

In an exemplary embodiment of the present invention, the N-type semiconductor layer, the I-type semiconductor layer, and the P-type semiconductor layer are formed in the opening of the second insulating layer.

According to an exemplary embodiment of the present invention, a display device includes: a display panel displaying an image; and a fingerprint sensor disposed on one surface of the display panel and sensing light having passed through the display panel. The fingerprint sensor includes: a thin film transistor disposed on a substrate; a first insulating layer disposed on the thin film transistor; a first sensing electrode disposed on the first insulating layer and connected to the thin film transistor; a second insulating layer disposed on the first sensing electrode and including an opening exposing the first sensing electrode; a sensing semiconductor layer disposed in the opening of the second insulating layer and on the first sensing electrode, and including an N-type semiconductor layer, an I-type semiconductor layer, and a P-type semiconductor layer; and a second sensing electrode disposed on the sensing semiconductor layer. An upper surface of the sensing semiconductor layer and an upper surface of the second insulating layer.

In an exemplary embodiment of the present invention, the I-type semiconductor layer is disposed on the N-type semiconductor layer, and the P-type semiconductor layer is disposed on the I-type semiconductor layer.

In an exemplary embodiment of the present invention, an upper surface of the P-type semiconductor layer and the upper surface of the second insulating layer are coplanar.

In an exemplary embodiment of the present invention, a width of the second sensing electrode is substantially the same as that of the P-type semiconductor layer.

In an exemplary embodiment of the present invention, a bottom surface of the second sensing electrode and the upper surface of the second insulating layer are coplanar.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF THE EMBODIMENTS

The present invention will now be described more fully hereinafter with reference to the accompanying drawings.

The present invention may, however, be embodied in different forms and should not be construed as limited to the embodiments set forth herein.

It will also be understood that when a layer is referred to as being "on" another layer or substrate, it can be directly on the other layer or substrate, or intervening layers may be present. The same reference numbers may indicate the same components throughout the specification, and thus, repetitive descriptions may be omitted.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present invention. Similarly, the second element could also be termed the first element.

Each of the features of the various exemplary embodiments of the present invention may be combined with each other, in part or in whole, and technically various interlocking and driving are possible. Each exemplary embodiment of the present invention may be implemented independently of each other or may be implemented together in an association.

Hereinafter, exemplary embodiments of the present invention will be described more fully with reference to the accompanying drawings.

Figure 1:
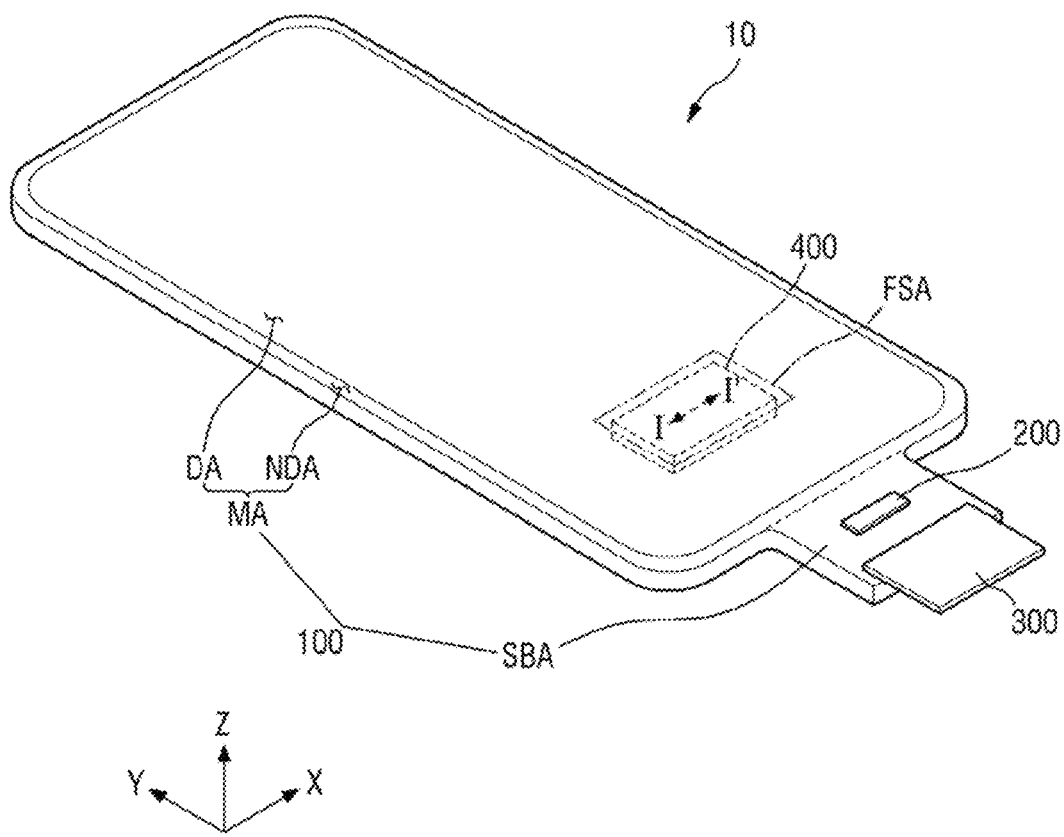
FIG. 1 is a perspective view illustrating a display device according to an exemplary embodiment of the present invention.

FIG. 1 is a perspective view illustrating a display device according to an exemplary embodiment of the present invention.

Referring to FIG. 1, a display device 10 is a device for displaying a moving image or a still image. The display device 10 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 may be, for example, a light emitting display device such as an organic light emitting display using an organic light emitting diode. In addition, the display device 10 may be a quantum dot light emitting display including a quantum dot light emitting layer. As another example, the display device 10 may be an inorganic light emitting display including an inorganic semiconductor, and a micro light emitting display using a micro light emitting diode (LED). In the following description, the display device 10, as an example, is an organic light emitting display device, but the present invention is not limited thereto.

The display device 10 may include a display panel 100, a display driving circuit 200, a circuit board 300, and a fingerprint sensor 400.

The display panel 100 may be formed in a rectangular shape, in a plan view, having short sides in a first direction (X-axis direction) and long sides in a second direction (Y-axis direction) crossing the first direction (X-axis direction). For example, the corner where the short side in the first direction (X-axis direction) and the long side in the second direction (Y-axis direction) meet may be rounded to have a predetermined curvature or may be right-angled. The planar shape of the display panel 100 is not limited to a rectangular shape, and may be formed in other polygonal shapes, a circular shape or elliptical shape. The display panel 100 may be formed to be flat, but the present invention is not limited thereto. For example, the display panel 100 may include a curved portion formed at left and right ends and having a predetermined curvature or a varying curvature. In addition, the display panel 100 may be formed to be flexible such that it can be bent, folded, or rolled.

The display panel 100 may include a main region MA and a sub-region SBA.

The main region MA may include a display area DA displaying an image and a non-display area NDA that is a peripheral area of the display area DA. The display area DA may include display pixels displaying, an image. The non-display area NDA may be an area from the boundary of the display area DA to the edge of the display panel 100.

The display area DA may include a fingerprint sensing area FSA. The fingerprint sensing area FSA indicates an area where the fingerprint sensor 400 is disposed. The fingerprint sensing area FSA may be a portion of the display area DA as shown in FIG. 1, but the present invention is not limited thereto. For example, the fingerprint sensing area FSA may be the entire area of display area DA, and may be substantially the same as the display area DA.

The sub-region SBA may protrude in the second direction (Y-axis direction) from one side of the main region MA. The length of the sub-region SBA in the first direction (X-axis direction) may be smaller than the length of the main region MA in the first direction (X-axis direction), and the length of the sub-region SBA in the second direction (Y-axis direction) may be smaller than the length of the main region MA in the second direction (Y-axis direction), but the present invention is not limited thereto.

Although FIG. 1 illustrates that the sub-region SBA is unfolded, the sub-region SBA may be bent. In this case, the sub-region SBA may be disposed on a bottom surface of the display panel 100. When the sub-region SBA is bent, the sub-region SBA may overlap the main region MA in the thickness direction (Z-axis direction) of the substrate SUB. The display driving circuit 200 may be disposed in the sub-region SBA.

The display driving circuit 200 may generate signals and voltages for driving the display panel 100. The display driving circuit 200 may be formed as an integrated circuit (IC) and attached onto the display panel 100 by, for example, a chip on glass (COG) method, a chip on plastic (COP) method, or an ultrasonic bonding method, but the present invention is not limited thereto. For example, the display driving circuit 200 may be attached onto the circuit board 300 by a chip on film (COF) method.

For example, the circuit board 300 may be attached to one end of the sub-region SBA of the display panel 100 using an anisotropic conductive film. Thus, the circuit board 300 may be electrically connected to the display panel 100 and the display driving circuit 200. The display panel 100 and the display driving circuit 200 may receive, for example, digital video data, timing signals, and driving voltages through the circuit board 300. The circuit board 300 may be a flexible film, such as a flexible printed circuit board, a printed circuit board, or a chip on film.

The fingerprint sensor 400 may be disposed on the display panel 100. For example, the fingerprint sensor 400 may be disposed on the bottom surface of the display panel 100. The fingerprint sensor 400 may be attached to the bottom surface of the display panel 100 using a transparent adhesive member. For example, the transparent adhesive member may be a transparent adhesive film such as an optically clear adhesive (OCA) film or a transparent adhesive resin such as an optically clear resin (OCR).

Figure 2:
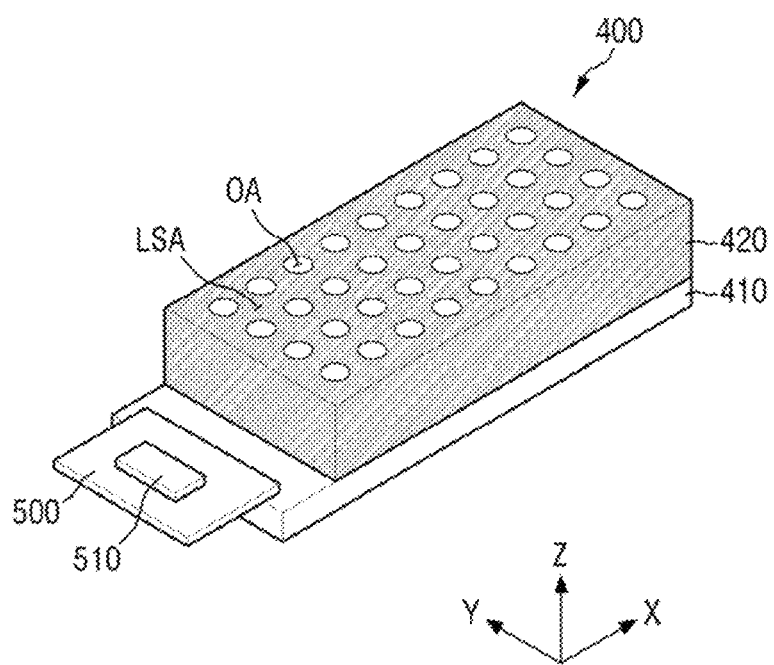
FIG. 2 is a perspective view of the fingerprint sensor of FIG. 1.

FIG. 2 is a perspective view of the fingerprint sensor of FIG. 1.

Referring to FIG. 2, the fingerprint sensor 400 may include a photosensitive layer 410 and a collimator layer 420.

The photosensitive layer 410 may include sensor pixels arranged in the first direction (X-axis direction) and the second direction (Y-axis direction). Each of the sensor pixels may include a photosensitive element through which a sensing current flows depending on incident light, at least one transistor connected to the photosensitive element, and at least one capacitor connected to the photosensitive element or the transistor. The photosensitive element may be a photo diode or a photo transistor.

The collimator layer 420 may be disposed on the photosensitive layer 410. The collimator layer 420 may include openings OA and a light blocking portion LSA. The openings OA may be arranged in the first direction (X-axis direction) and the second direction (Y-axis direction), and the light blocking portion LSA may be disposed between the openings OA. Each of the openings OA may be a light transmitting area, and the light blocking portion LSA may be a light blocking area. For example, each of the openings OA may have a circular shape in a plan view as shown in FIG. 2, but the present invention is not limited thereto. Each of the openings OA may have an elliptical or polygonal shape in a plan view.

A fingerprint circuit board 500 may be disposed on a portion of the photosensitive layer 410 that is not covered by the collimator layer 420. The fingerprint circuit board 500 may be attached to the top surface of the portion of the photosensitive layer 410 that is not covered by the collimator layer 420 using an anisotropic conductive film. Accordingly, the fingerprint circuit board 500 may be electrically connected to the sensor pixels of the photosensitive layer 410. Therefore, each of the sensor pixels of the photosensitive layer 410 may output a sensing voltage in response to the sensing current of the photosensitive element through the fingerprint circuit board 500. A fingerprint driving circuit 510 electrically connected to the fingerprint circuit hoard 500 may recognize a fingerprint pattern of a finger based on the sensing voltages of the sensor pixels.

The fingerprint driving circuit 510 may be disposed on the fingerprint circuit board 500 as shown in FIG. 2, but the present invention is not limited thereto. For example, the fingerprint driving circuit 510 may be disposed on a separate circuit board that is electrically connected to the fingerprint circuit board 500. For example, the fingerprint circuit board 500 may be a flexible printed circuit board, a printed circuit board, or a flexible film such as a chip-on film.

Figure 3:
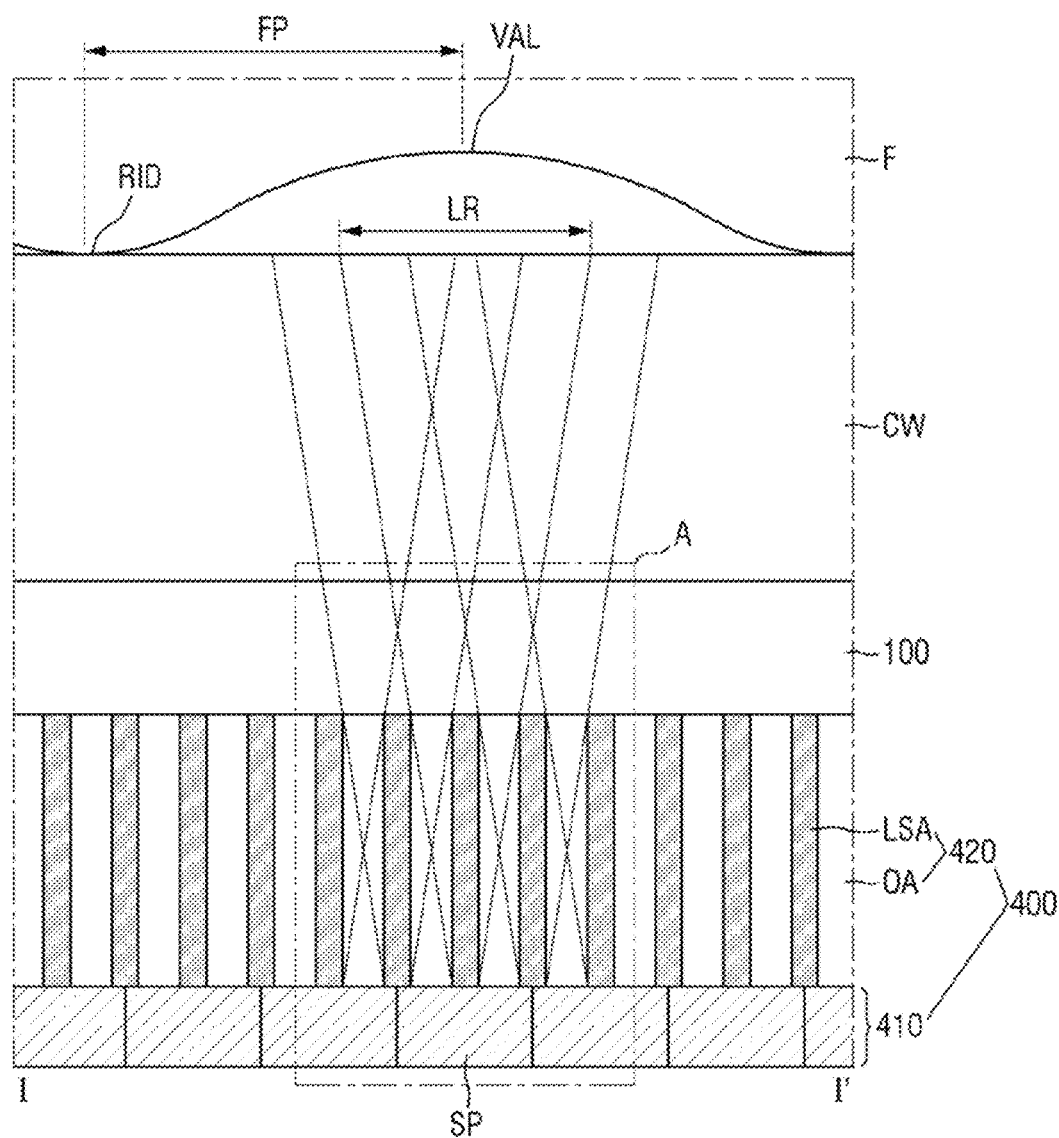
FIG. 3 is a cross-sectional view illustrating a display panel and a fingerprint sensor taken along line I-I' of FIG. 1.

FIG. 3 is a cross-sectional view illustrating a display panel and a fingerprint sensor taken along line I-I' of FIG. 1. FIG. 3 illustrates that a user touches the display device 10 with a finger F for fingerprint authentication.

Referring to FIG. 3, the display device 10 further includes a cover window CW disposed on the display panel 100. For example, the cover window CW may be disposed on the top surface of the display panel 100. The cover window CW may be disposed above the display panel 100 to cover the top surface of the display panel 100. The cover window CW may serve to protect the top surface of the display panel 100. The cover window CW may be attached to the top surface of the display panel 100 using a transparent adhesive member.

The cover window CW is made of a transparent material such as glass or plastic. For example, when the cover window CW is made of glass, the cover window CW may be ultra-thin glass (UTG) having a thickness of about 0.1 mm or less. When the cover window CW is made of plastic, the cover window CW may include a transparent polyimide film.

The fingerprint sensor 400 may be disposed on the display panel 100. For example, the fingerprint sensor 400 may be disposed on the bottom surface of the display panel 100. The fingerprint sensor 400 may be attached to the bottom surface of the display panel 100 using a transparent adhesive member.

The fingerprint sensor 400 may include the photosensitive layer 410 and the collimator 420. The photosensitive layer 410 may include the sensor pixels SP, and the collimator layer 420 may include the openings OA and the light blocking portion LSA disposed between the openings OA. Each of the sensor pixels SP may overlap the openings OA of the collimator layer 420 in a third direction (Z-axis direction).

Each of the openings OA of the collimator layer 420 may be a passage on which light reflected by a ridge RID and a valley VAL of a fingerprint of the finger F is incident. For example, when the user's finger F is in contact with the cover window CW, the light outputted from the display panel 100 may be reflected by the ridge RID and the valley VAL of the fingerprint of the finger F. The light reflected by the finger F may be incident on the sensor pixels SP of the photosensitive layer 310 through the display panel 100 and the openings OA of the collimator layer 420.

A range LR of the light incident on the sensor pixels SP through the openings OA of the collimator layer 420 may be narrower than a distance FP between the lowermost point of the ridge RID and the peak of the valley VAL of the fingerprint of the finger F. The distance FP between the ridge RID and the valley VAL of the fingerprint of the finger F may be about 500 μm. Accordingly, the sensing currents flowing through the photosensitive elements of the sensor pixels SP may be different depending on whether the light is reflected by the ridge RID of the fingerprint of the finger F or by the valley VAL of the fingerprint of the finger F. Therefore, the sensing voltages outputted from the sensor pixels SP may be different depending on whether the light is reflected by the ridge RID of the fingerprint of the finger F or by the valley VAL of the fingerprint of the finger F. Thus, the fingerprint driving circuit 510 may recognize the fingerprint pattern of the finger F based on the sensing voltages of the sensor pixels SP.

Figure 4:
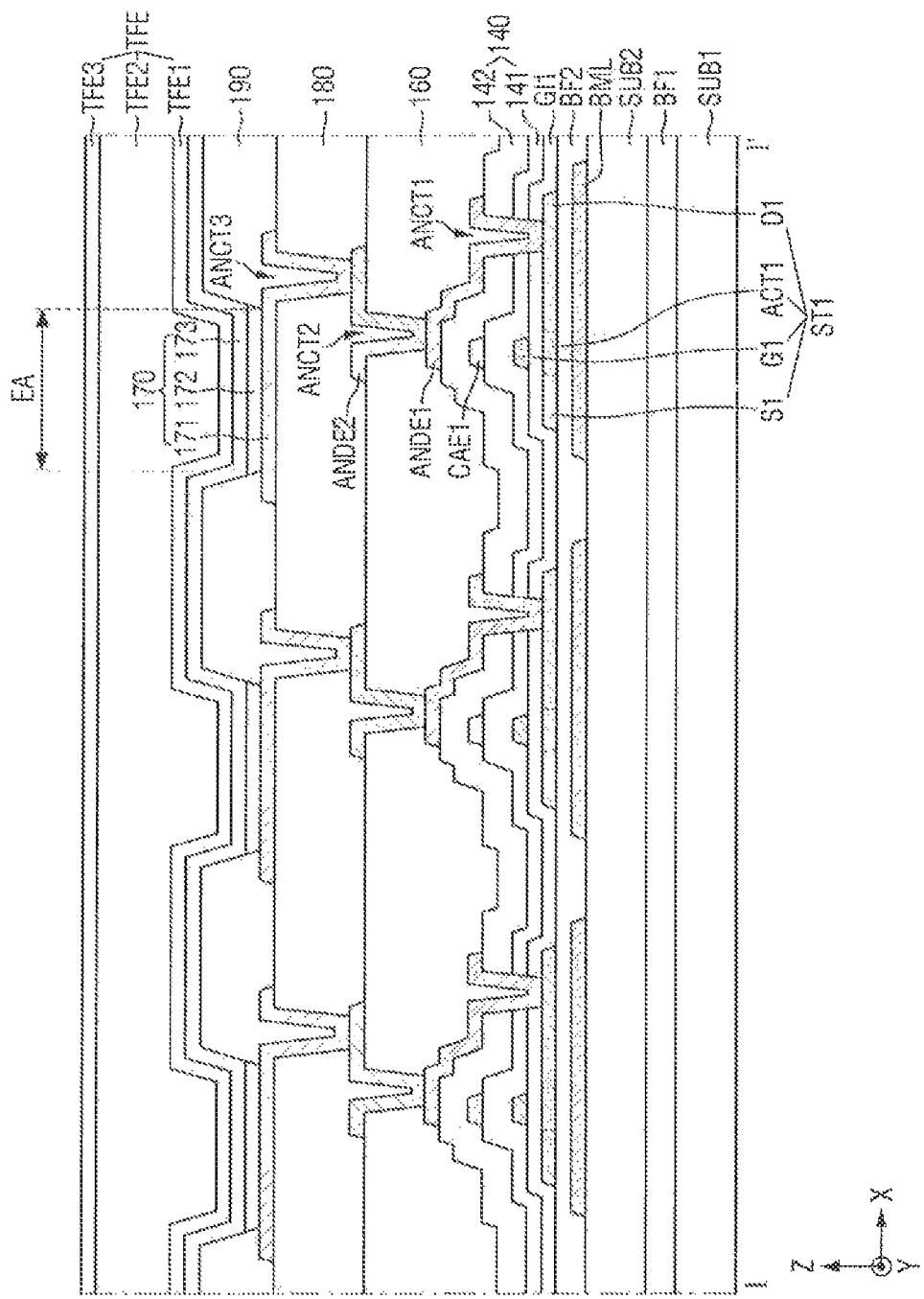
FIG. 4 is an enlarged cross-sectional view illustrating the display panel in area A of FIG. 3.

FIG. 4 is an enlarged cross-sectional view illustrating the display panel in area A of FIG. 3.

Referring to FIG. 4, the display panel 100 may include display pixels DP for displaying an image. Each of the display pixels DP may include a first thin film transistor ST1 and a light emitting element 170.

A first buffer layer BF1 may be disposed on a first substrate SUB1. A second substrate SUB2 may be disposed on the first buffer layer BF1, and a second buffer layer BF2 may be disposed on the second substrate SUB2.

Each of the first substrate SUB1 and the second substrate SUB2 may be made of an insulating material such as polymer resin or the like. For example, the first substrate SUB1 and the second substrate SUB2 may be made of polyimide. For example, each of the first substrate SUB1 and the second substrate SUB2 may be a flexible substrate which can be bent, folded and rolled.

Each of the first buffer layer BF1 and the second buffer layer BF2 is a film for protecting thin film transistors and a light emitting layer 172 of the light emitting element 170 from moisture permeating through the first substrate SUB1 and the second substrate SUB2 which may be susceptible to moisture permeation. For example, each of the first buffer layer BF1 and the second buffer layer BF2 may be formed of a plurality of inorganic layers that are alternately stacked. For example, each of the first buffer layer BF1 and the second buffer layer BF2 may be formed of multiple layers in which one or more inorganic layers of, for example, a silicon nitride layer, a silicon oxynitride layer, a silicon oxide layer, a titanium oxide layer and an aluminum oxide layer are alternately stacked. However, the present invention is not limited thereto. For example, each of the first buffer layer BF1 and the second buffer layer BF2 may be a single layer.

A light blocking layer BML may be disposed on the second substrate SUB2 to be positioned between the second substrate SUB2 and the second buffer layer BF2. The light blocking layer BML may overlap a first active layer ACT1 of the first thin film transistor ST1 in the third direction (Z-axis direction) to prevent a leakage current from being generated when light is incident on the first active layer ACT1 of the first thin film transistor ST1. The light blocking layer BML may be formed as a single layer or multiple layers made of any one of, for example, molybdenum (Mo), aluminum (Al), chromium (Cr), gold (Au), titanium (Ti), nickel (Ni), neodymium (Nd) and copper (Cu) or an alloy thereof. The light blocking layer BML may be omitted.

The first active layer ACT1 of the first thin film transistor ST1 may be disposed on the second buffer layer BF2. The first active layer ACT1 of the first thin film transistor ST1 may include, for example, polycrystalline silicon, monocrystalline silicon, low-temperature polycrystalline silicon, amorphous silicon, and/or an oxide semiconductor. The first active layer ACT1 of the first thin film transistor ST1 is doped with impurities or ions, prior to being covered by a first gate insulating layer GI1, and thus may have conductivity. The conductive region of the first active layer ACT1 may include a first source electrode S1 and a first drain electrode D1.

The first gate insulating layer GI1 may be disposed on the first active layer ACT1 of the first thin film transistor ST1. Further, the first gate insulating layer GI1 is disposed between the first active layer ACT1 and a first gate electrode G1 of the first thin film transistor ST1, but present invention is not limited thereto. The first gate insulating layer GI1 may be disposed between a first interlayer insulating layer 141 and the first active layer ACT1 and between the first interlayer insulating layer 141 and the second buffer layer BF2. The first gate insulating layer GI1 may be formed of an inorganic layer, for example, a silicon nitride layer, a silicon oxynitride layer, a silicon oxide layer, a titanium oxide layer, or an aluminum oxide layer.

The first gate electrode G1 of the first thin film transistor ST1 may be disposed on the first gate insulating layer GI1. The first gate electrode G1 of the first thin film transistor ST1 may overlap the first active layer ACT1 in the third direction (Z-axis direction). The first gate electrode G1 of the first thin film transistor ST1 may be formed as a single layer or multiple layers made of any one of, for example, molybdenum (Mo), aluminum (Al), chromium (Cr), gold (Au), titanium (Ti), nickel (Ni), neodymium (Nd) and copper (Cu) or an alloy thereof.

Although FIG. 4 illustrates that the first thin film transistor ST1 is formed by a top gate method in which the first gate electrode G1 is located above the first active layer ACT1 the present invention is not limited thereto. For example, the first thin film transistor ST1 may be formed by a bottom gate method in which the first gate electrode G1 is located below the first active layer ACT1, or a double gate method in which the first gate electrode G1 is located both above and below the first active layer ACT1.

The first interlayer insulating layer 141 may be disposed on the first gate electrode G1 of the first thin film transistor ST1. The first interlayer insulating layer 141 may be formed of an inorganic layer, for example, a silicon nitride layer, a silicon oxynitride layer, a silicon oxide layer, a titanium oxide layer, and/or an aluminum oxide layer. For example, the first interlayer insulating layer 141 may include a plurality of inorganic layers.

A first capacitor electrode CAE1 may be disposed on the first interlayer insulating layer 141. The first capacitor electrode CAE1 may overlap the first gate electrode G1 of the first thin film transistor ST1 in the third direction (Z-axis direction). Since the first interlayer insulating layer 141 has a predetermined dielectric constant, the first interlayer insulating layer 141 may be disposed between the first capacitor electrode CAE1 and the first gate electrode G1 to form a capacitor. For example, the first capacitor electrode CAE1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second interlayer insulating layer 142 may be disposed on the first capacitor electrode CAE1. The second interlayer insulating layer 142 may be formed of an inorganic layer, for example, a silicon nitride layer, a silicon oxynitride layer, a silicon oxide layer, a titanium oxide layer, and/or an aluminum oxide layer. The second interlayer insulating layer 142 may include a plurality of inorganic layers.

A first anode connection electrode ANDE1 may be disposed on the second interlayer insulating layer 142. The first anode connection electrode ANDE1 may penetrate through the first interlayer insulating layer 141 and the second interlayer insulating layer 142 to be connected to the first drain electrode D1 of the first thin film transistor ST1 via a first anode contact hole ANCT1 that exposes the first drain electrode D1 of the first thin film transistor ST1. The first anode connection electrode ANDE1 may be formed as a single layer or multiple layers made of any one of, for example, molybdenum (Mo), aluminum (Al), chromium (Cr), gold (Au), titanium (Ti), nickel (Ni), neodymium (Nd) and copper (Cu) or an alloy thereof.

A first organic layer 160 for planarization may be disposed on the first anode connection electrode ANDE1. The first organic layer 160 may be formed of an organic layer such as acryl resin, epoxy resin, phenolic resin, polyamide resin, polyimide resin and the like.

A second anode connection electrode ANDE2 may be disposed on the first organic layer 160. The second anode connection electrode ANDE2 may penetrate through the first organic layer 160 to be connected to the second anode connection electrode ANDC2 via a second anode contact hold ANCT2 that exposes the first anode connection electrode ANDE1. The second anode connection electrode ANDE2 may be formed as a single layer or multiple layers made of any one of, for example, molybdenum (Mo), aluminum (Al), chromium (Cr), gold (Au), titanium (Ti), nickel (Ni), neodymium (Nd) and copper (Cu) or an alloy thereof.

A second organic layer 180 may be disposed on the second anode connection electrode ANDE2. The second organic layer 180 may be formed of an organic layer such as acryl resin, epoxy resin, phenolic resin, polyamide resin, polyimide resin and the like.

The light emitting elements 170 and a bank 190 may be disposed on the second organic layer 180. Each of the light emitting elements 170 may include a first light emitting electrode 171, the light emitting layer 172, and a second light emitting electrode 173.

The first light emitting electrode 171 may be formed on the second organic layer 180. The first light emitting electrode 171 may penetrate through the second organic layer 180 to be connected to the second anode connection electrode ANDE2 via a third anode contact hole ANCT3 that exposes the second anode connection electrode ANDE2.

In a top emission structure in which light is emitted toward the second light emitting electrode 173 when viewed with respect to the light emitting layer 172, the first light emitting, electrode 171 may be turned of a metal material having a relatively high reflectivity to have a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd) and copper (Cu).

The bank 190 may be formed on the second organic layer 180 to partition the first light emitting electrode 171, thereby forming an emission area EA. The bank 190 may be formed to cover the edge of the first light emitting electrode 171. The bank 190 may be formed of an organic layer such as actyl resin, epoxy resin, phenolic resin, polyamide resin, polyimide resin and the like.

The emission area EA represents an area in which the first light emitting electrode 171, the light emitting layer 172, and the second light emitting electrode 173 are sequentially stacked. Further, the holes, which are from the first light emitting electrode 171, and electrons, which are from the second light emitting electrode 173, are combined with each other in the light emitting layer 172 to emit light.

The light emitting layer 172 may be disposed on the first light emitting electrode 171 and the bank 190. The light emitting layer 172 may include an organic material to emit light in a predetermined color. For example, the light emitting layer 172 includes a hole transporting layer, an organic material layer, and an electron transporting layer.

The second light emitting electrode 173 may be disposed on the light emitting layer 172. The second light emitting electrode 173 may be formed to cover the light emitting layer 172. The second light emitting electrode 173 may be a common layer formed in common for all the emission areas EA. However, the present invention is not limited thereto, and for example, the second light emitting electrode 173 may not be a common layer. In addition, a capping layer may be formed on the second light emitting electrode 173.

In the top emission structure, the second light emitting electrode 173 may be formed of transparent conductive oxide (TCO) such as indium tin oxide (ITO) and indium zinc oxide (IZO) capable of transmitting light or a semi-transmissive conductive material such as magnesium (Mg), silver (Ag), or an alloy of magnesium (Mg) and silver (Ag). When the second light emitting electrode 173 is formed of a semi-transmissive conductive material, the light emission efficiency can be increased due to a micro-cavity effect.

An encapsulation layer TFE may be disposed on the second light emitting electrode 173. The encapsulation layer TFE may include at least one inorganic layer to prevent oxygen or moisture from permeating into the light emitting layer 172 of the light emitting element 170. In addition, the encapsulation layer TFE may include at least one organic layer to protect the light emitting, layer 172 of the light emitting element 170 from foreign substances such as dust.

For example, the encapsulation layer TFE may include a first inorganic layer TFE1, an organic layer TFE2, and a second inorganic layer TFE3.

The first inorganic layer TFE1 the organic layer TFE2 and the second inorganic layer TFE3 may be sequentially disposed on the second light emitting electrode 173 in that order. For example, the first inorganic layer TFE1 and the second inorganic layer TFE3 may be formed of multiple layers in which one or more inorganic layers of a silicon nitride layer, a silicon oxynitride layer, a silicon oxide layer, a titanium oxide layer and/or an aluminum oxide layer are alternately stacked. The organic layer TFE2 may be a monomer.

Figure 5:
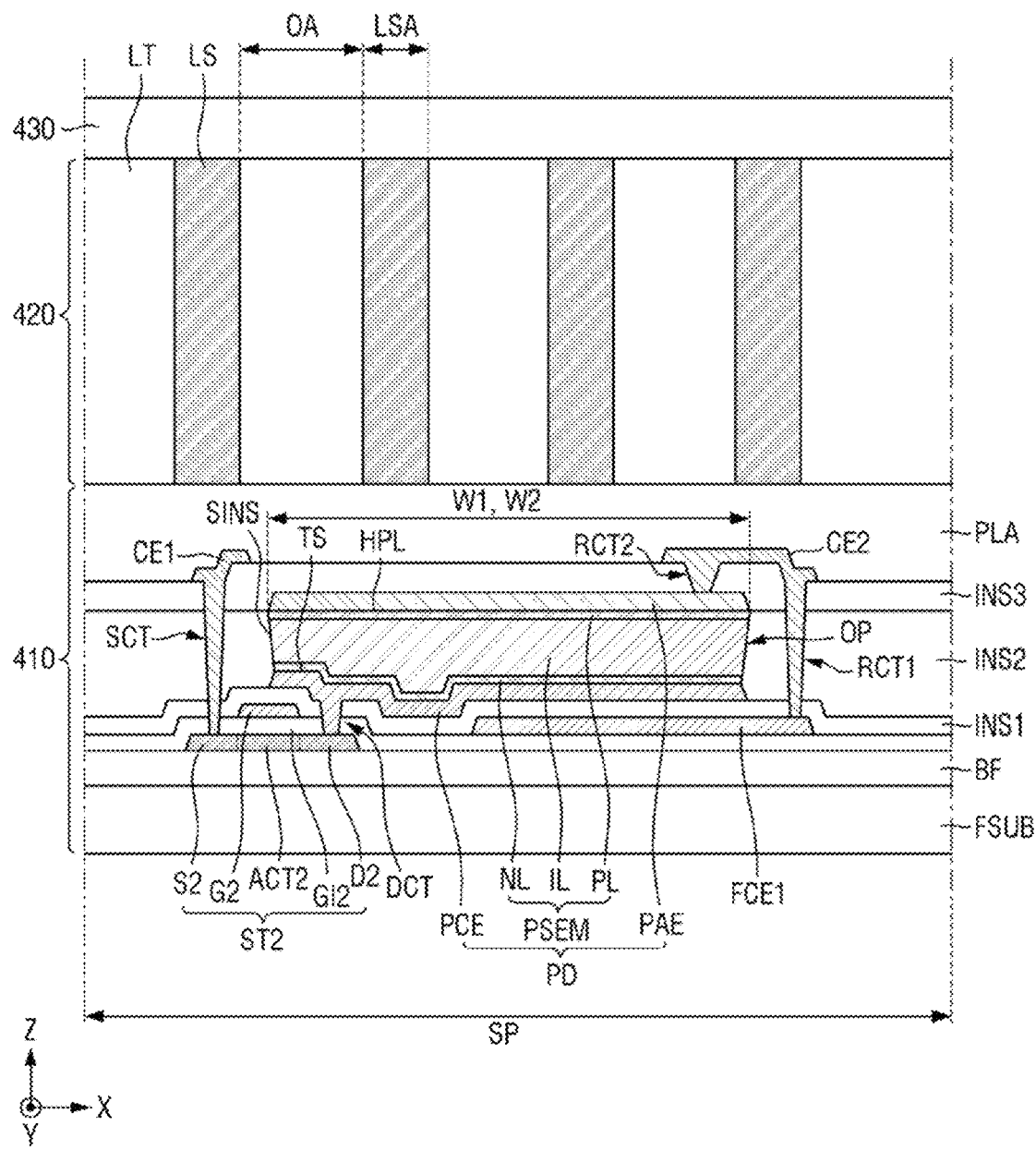
FIG. 5 is an enlarged cross-sectional view illustrating the fingerprint sensor in area A of FIG. 3.
Figure 6:
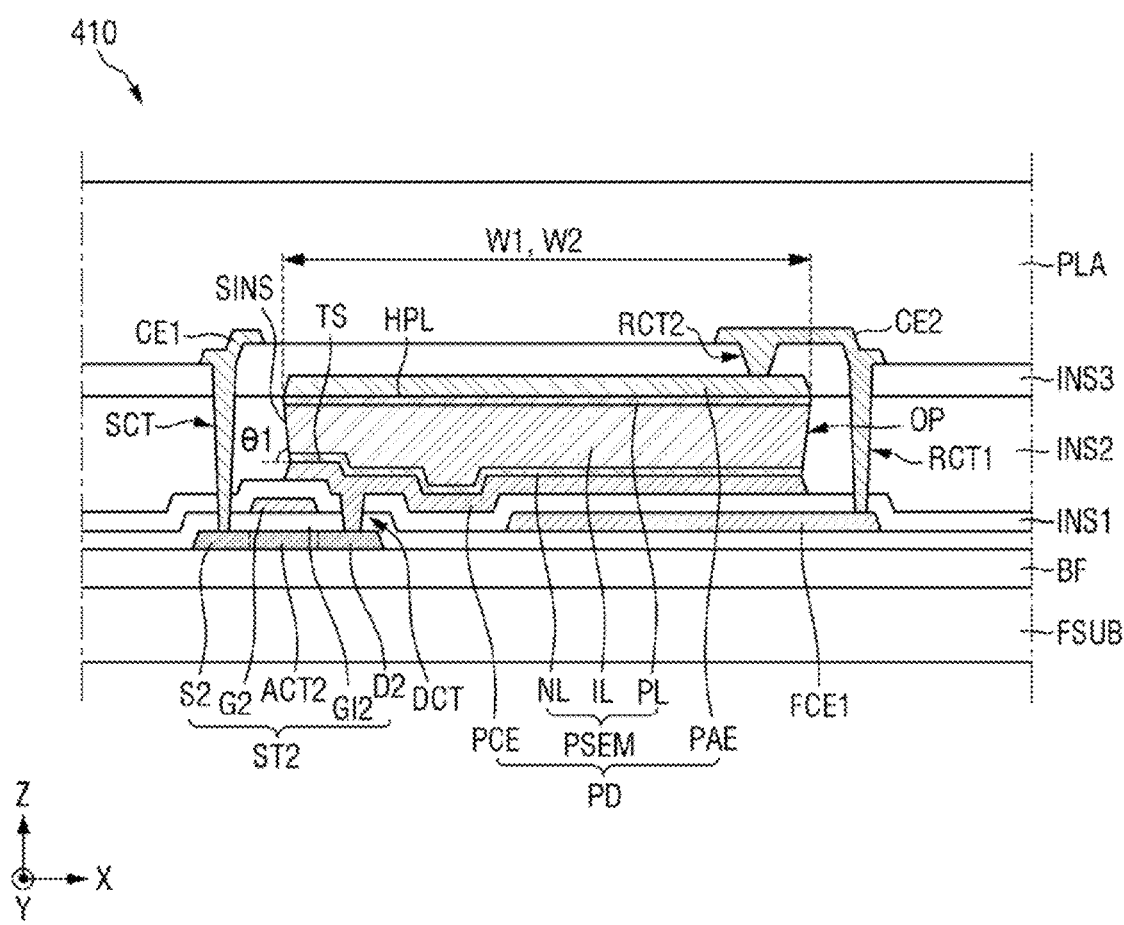
FIG. 6 is an enlarged cross-sectional view illustrating the photosensitive layer of FIG. 5.
Figure 7:
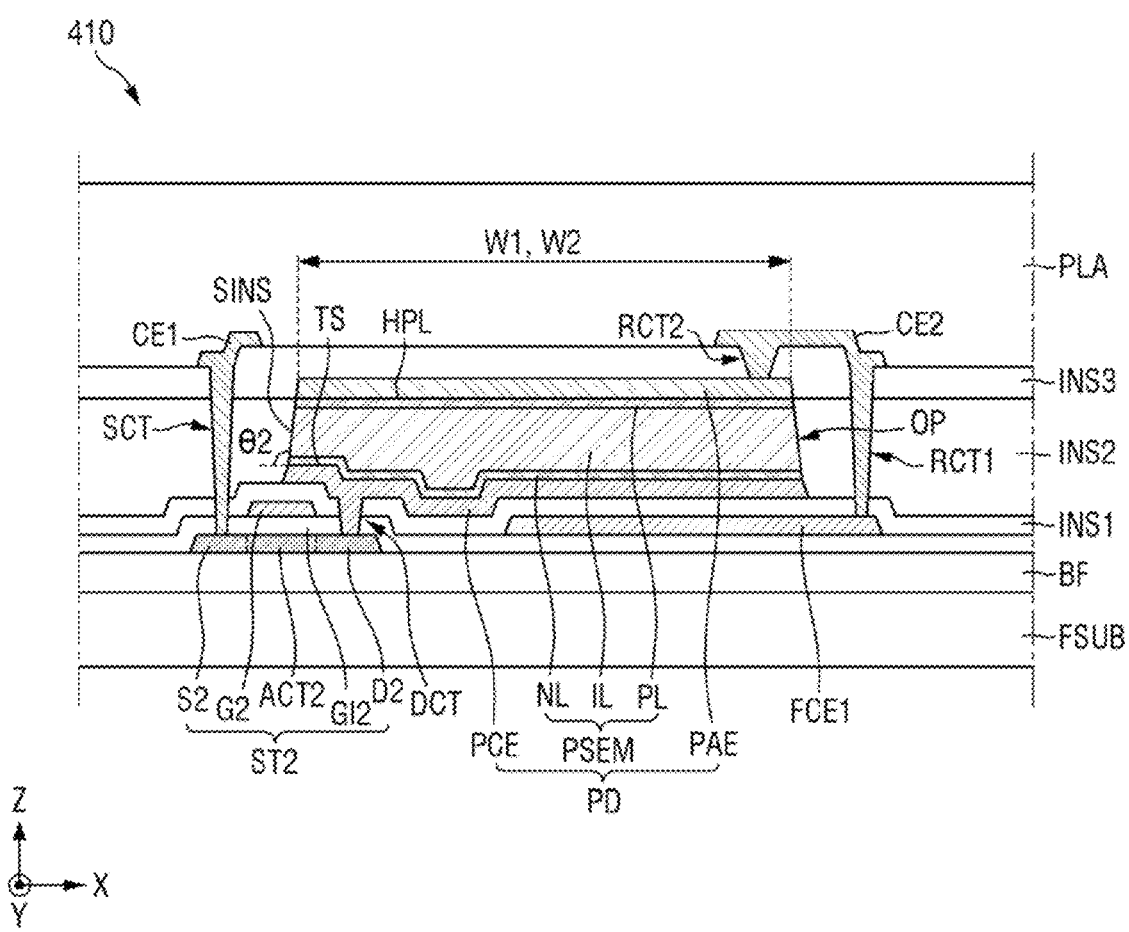
FIG. 7 is an enlarged cross-sectional view illustrating the photosensitive layer of FIG. 5.
Figure 8:
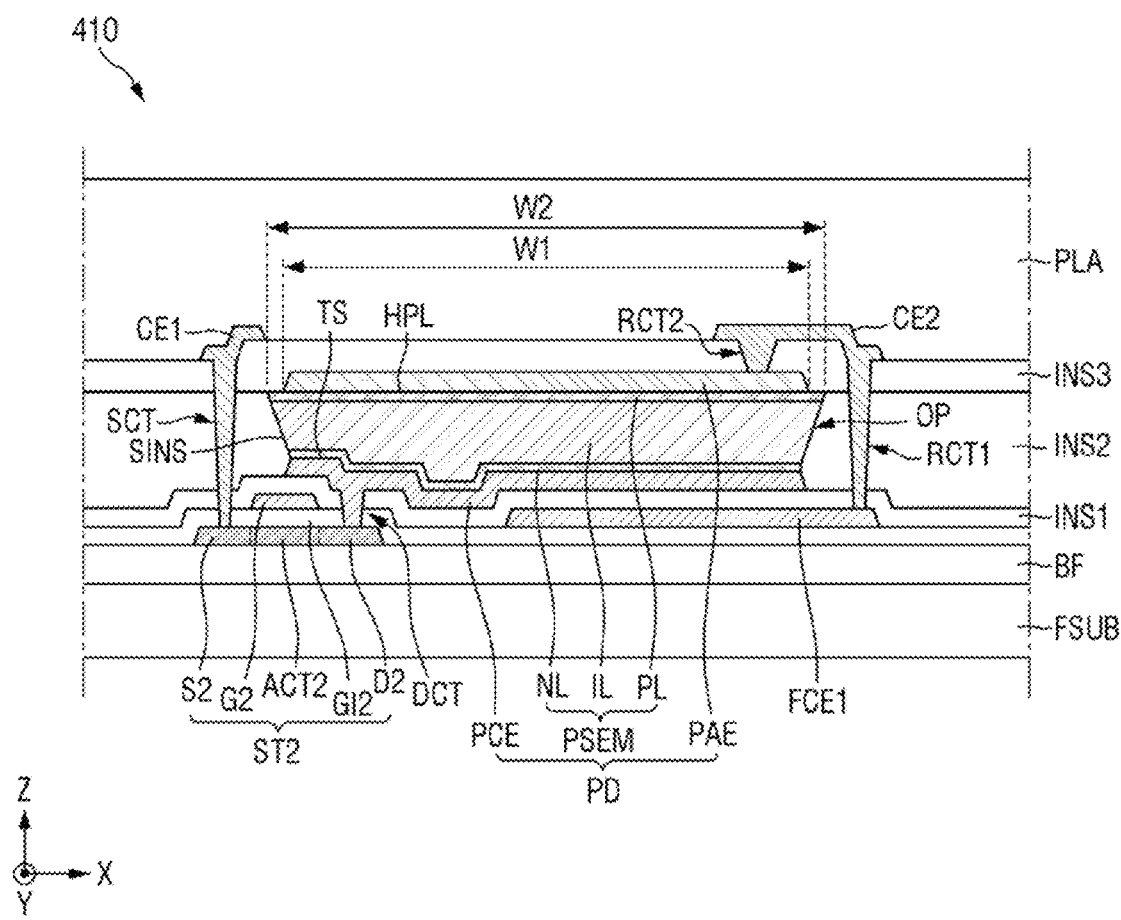
FIG. 8 is an enlarged cross-sectional view illustrating the photosensitive layer of FIG. 5.

FIG. 5 is an enlarged cross-sectional view illustrating the fingerprint sensor in area A of FIG. 3. FIG. 6 is an enlarged cross-sectional view illustrating the photosensitive layer of FIG. 5. FIG. 7 is an enlarged cross-sectional view illustrating the photosensitive layer of FIG. 5. FIG. 8 is an enlarged cross-sectional view illustrating the photosensitive layer of FIG. 5.

Referring to FIGS. 5 and 6, the fingerprint sensor 400 may include the photosensitive layer 410 and the collimator layer 420 disposed on the photosensitive layer 410.

The photosensitive layer 410 may include the sensor pixels SP for sensing light. Each of the sensor pixels SP may include a second thin film transistor ST2 and a photosensitive element PD.

A buffer layer BF may be disposed on a fingerprint sensor substrate FSUB. The fingerprint sensor substrate FSUB may be made of an insulating material such as polymer resin or the like. For example, the fingerprint sensor substrate FSUB may be made of polyimide. Each fingerprint sensor substrate FSUB may be a flexible substrate that can be bent, folded and rolled.

The buffer layer BF is a layer for protecting the thin film transistor and the photosensitive element PD of the photosensitive layer 410 from moisture penetrating, through the fingerprint sensor substrate FSUB susceptible to moisture permeation. The buffer layer BF may be formed of a plurality of inorganic layers that are alternately stacked. For example, the buffer layer BF may be formed of multiple layers in which one or more inorganic layers at a silicon nitride layer, a silicon oxynitride layer, a silicon oxide layer, a titanium oxide layer and an aluminum oxide layer are alternately stacked.

A second active layer ACT2 of the second thin film transistor ST2 may be disposed on the buffer layer BF. The second active layer ACT2 of the second thin film transistor ST2 may include polycrystalline silicon, monocrystalline silicon, low-temperature polycrystalline silicon, amorphous silicon, or an oxide semiconductor. The second active layer ACT2 is doped with impurities or ions, and thus may have conductivity. The conductive regions of the second active layer ACT2 may be formed as a second source electrode S2 and a second drain electrode D2 of the second active layer ACT2 of the second thin film transistor ST2.

A second gate insulating layer GI2 may be disposed on the second active layer ACT2 of the second thin film transistor ST2. The second gate insulating layer GI2 may also be disposed between the first insulating layer INS1 and the second active layer ACT2 and between the first insulating layer INS1 and the buffer layer BF. The second gate insulating layer GI2 may be formed of an inorganic layer, for example, a silicon nitride layer a silicon oxynitride layer, a silicon oxide layer, a titanium oxide layer, or an aluminum oxide layer.

A second gate electrode G2 of the second thin film transistor ST2 and a first fingerprint capacitor electrode FCE1 may be disposed on the second gate insulating layer GI2. The second gate electrode G2 of the second thin film transistor ST2 may overlap the second active layer ACT2 in the third direction (Z-axis direction). For example, the second gate electrode G2 may overlap a channel region between the second source electrode S2 and the second drain electrode D2. The second gate electrode G2 of the second thin film transistor ST2 and the first fingerprint capacitor electrode FCE1 may be formed as a single layer or multiple layers made of any one of molybdenum (Mo), aluminum (Al), chromium (Cr), gold (Au) titanium (Ti), nickel (Ni), neodymium (Nd) and copper (Cu) or an alloy thereof.

The first insulating layer INS1 may be disposed on the second gate electrode G2 of the second thin film transistor ST2 and the first fingerprint capacitor electrode FCE1. The first insulating layer INS1 may be formed of an inorganic layer, for example, a silicon nitride layer, a silicon oxynitride layer, a silicon oxide layer, a titanium oxide layer, and or an aluminum oxide layer. The first insulating layer INS1 may include a plurality of inorganic layers.

The photosensitive element PD may be disposed on the first insulating layer INS1. The photosensitive element PD may be a photo diode as shown in FIG. 5, but the present invention is not limited thereto. For example, the photosensitive element PD may be a photo transistor. The photosensitive element PD may include a first sensing electrode PCE, a sensing semiconductor layer PSEM, and a second sensing electrode PAE. The first sensing electrode PCE may be a cathode electrode, and the second sensing electrode PAE may be an anode electrode.

The first sensing electrode PCE may be disposed on the first insulating layer INS1. The first sensing electrode PCE and the first fingerprint capacitor electrode FCE1 may be formed of a single layer containing molybdenum (Mo), titanium (Ti), copper (Cu), or aluminum (Al), or may be formed to have a stacked structure of aluminum and titanium (Ti/Al/Ti), a stacked structure of aluminum and indium tin oxide (ITO) (ITO/Al/ITO), an Ag—Pd—Cu (APC) alloy, or a stacked structure of APC alloy and ITO (ITO, APC/ITO).

The first sensing, electrode PCE may overlap the first fingerprint capacitor electrode PCE1 in the third direction (Z-axis direction). Since the first insulating layer INS1 has a predetermined dielectric constant, the first insulating layer INS1 may be disposed between the first fingerprint capacitor electrode FCE1 and the first sensing electrode PCE to form a capacitor.

The first sensing electrode PCE, may penetrate through the second gate insulating layer GI2 and the first insulating layer INS1 to be connected to the second drain electrode D2 of the second thin film transistor ST2 via a drain contact hole DCT that exposes the second drain electrode D2 of the second thin film transistor ST2.

A second insulating layer INS2 may be disposed on the first sensing electrode PCE. The first insulating layer INS1 may be formed of an inorganic layer, for example, a silicon nitride layer, a silicon oxynitride layer, a silicon oxide layer, a titanium oxide layer, or an aluminum oxide layer. The first insulating layer INS1 may include a plurality of inorganic layers.

The second insulating layer INS2 may include an opening OP that exposes the first sensing electrode PCE. For example, the opening, OP may be a hole that exposes the top surface of the first sensing electrode PCE. The sensing semiconductor layer PSEM to be described later may be accommodated in the opening OP, and the second insulating layer INS2 may serve to protect the sensing semiconductor layer PSEM. For example, the sensing semiconductor layer PSEM may be disposed in the opening OP.

The second insulating layer INS2 may include a side surface SINS forming an inner peripheral surface of the opening OP. The side surface SINS of the second insulating layer INS2 may be tapered or have a slope with respect to a top surface TS of the first sensing electrode PCE. For example, the side surface SINS of the second insulating layer INS2 may have a positive taper with respect to a top surface TS of the first sensing electrode PCE. A first taper angle θ1 formed by the side surface SINS of the second insulating layer INS2 and the top surface TS of the first sensing electrode PCE is within a range of about 40 degrees or more and less than about 90 degrees, so that the step coverage of the sensing semiconductor layer PSEM stacked along the opening OP is increased, which makes it possible to prevent occurrence of a short circuit. In an exemplary embodiment of the present invention, the width of the opening OP of the second insulating layer INS2 may become gradually decreased toward the fingerprint sensor substrate FSUB.

In addition, as shown in FIG. 7, the side surface SINS of the second insulating layer INS2 may have a reverse taper with respect to the top surface TS of the first sensing electrode PCE. A second taper angle θ2 formed by the side surface SINS of the second insulating layer INS2 and the top surface TS of the first sensing electrode PCE may be within a range of about 90 degrees to about 140 degrees. In an exemplary embodiment of the present invention, the width of the opening OP of the second insulating layer INS2 may become gradually increased toward the fingerprint sensor substrate FSUB.

Referring back to FIGS. 5 and 6, the sensing semiconductor layer PSEM may be disposed on the first sensing electrode PCE. The sensing semiconductor layer PSEM may have a PIN structure in which a P-type semiconductor layer PL, an I-type semiconductor layer IL, and an N-type semiconductor layer NL are sequentially stacked on each other. When the sensing semiconductor layer PSEM has the PIN structure, the I-type semiconductor layer IL is depleted by the P-type semiconductor layer PL and the N-type semiconductor layer NL, and an electric field is generated therein. Further, holes and electrons generated by the sunlight are drifted by, the electric field. Accordingly, the holes may be collected in the second sensing electrode PSE through the P-type semiconductor layer PL, and the electrons may be collected in the first sensing electrode PCE through the N-type semiconductor layer NL.

The P-type semiconductor layer PL may be disposed close to the surface on which external light is incident, and the N-type semiconductor layer NL may be disposed distant from the surface on which external light is incident. For example, compared to the N-type semiconductor, the P-type semiconductor is closer to the surface on which external light is incident. Since the drift mobility of the hole is lower than that of the electron, it is desirable that the P-type semiconductor layer PL is formed close to the surface on which external light is incident to maximize the collection efficiency by incident light.

The N-type semiconductor layer NL may be disposed on the first sensing electrode PCE. In addition, the I-type semiconductor layer IL may be disposed on the N-type semiconductor layer NL, and the I-type semiconductor layer PL may be disposed on the I-type semiconductor layer IL. In this case, the P-type semiconductor layer PL may be formed by doping a P-type dopant into amorphous silicon (a-Si:H).

The I-type semiconductor layer IL may be made of amorphous silicon germanium (a-SiGe:H) or amorphous silicon carbide (a-SiC:H). The N-type semiconductor layer NL may be formed by doping an N-type dopant into amorphous silicon germanium (a-SiGe:H) or amorphous silicon carbide (a-SiC:H). The P-type semiconductor layer PL and the N-type semiconductor layer NL may have a thickness of about 500 Å, and the I-type semiconductor layer IL may have a thickness of about 5,000 Å to about 10,000 Å.

In an exemplary embodiment of the present invention, the N-type semiconductor layer NL may be disposed on the first sensing electrode PCE. Further, the I-type semiconductor layer may be omitted, and the P-type semiconductor layer PL may be disposed on the N-type semiconductor layer NL. In this case, the P-type semiconductor layer PL may be formed by doping a P-type dopant into amorphous silicon (a-Si:H). The N-type semiconductor layer NL may be formed by doping an N-type dopant into amorphous silicon germanium (a-SiGe:H) or amorphous silicon carbide (a-SiC:H). The P-type semiconductor layer PL and the N-type semiconductor layer NL may have a thickness of about 500 Å.

Further, a top surface or a bottom surface of at least one of the first sensing electrode PCE, the P-type semiconductor layer PL, the I-type semiconductor layer IL, the N-type semiconductor layer NL, and the second sensing electrode PAE may have a concave-convex structure by a texturing process to increase an absorption rate of external light. The texturing process is a process of forming a concave-convex structure on a surface of a material, such as a surface of a fabric. The texturing process may be performed by, for example, etching using photolithography, anisotropic etching using a chemical solution, a groove forming process using mechanical scribing, or the like.

In an exemplary embodiment of the present invention, the sensing semiconductor layer PSEM including the N-type semiconductor layer NL, the I-type semiconductor layer IL, and the P-type semiconductor layer PL may be accommodated in the opening OP of the second insulating layer INS2. Here, "the sensing semiconductor layer PSEM is accommodated in the opening OP" indicates that the sensing semiconductor layer PSEM is disposed in the opening OP.

For example, the N-type semiconductor layer NL may be disposed on the top surface of the first sensing electrode PCE. For example, the N-type semiconductor layer NL may be disposed in the opening OP to be in direct contact with the top surface of the first sensing electrode PCE and the side surface SINS of the second insulating layer INS2.

The I-type semiconductor layer IL may be disposed on the N-type semiconductor layer NL to fill the opening OP of the second insulating layer INS2. The I-type semiconductor layer IL has a thickness that is approximately several tens of times greater than those of the N-type semiconductor layer NL and the P-type semiconductor layer PL, and thus can fill substantially the entire opening OP. The I-type semiconductor layer IL may also be disposed on the side surface SINS of the second insulating layer INS2 in the opening OP. In an exemplary embodiment of the present invention, the I-type semiconductor layer IL may be in direct contact with the top surface of the N-type semiconductor layer NL and the side surface SINS of the second insulating layer INS2.

The P-type semiconductor layer PL may be disposed on the I-type semiconductor layer IL inside the opening OP of the second insulating layer INS2. In an exemplary embodiment of the present invention, the P-type semiconductor layer PL may be in direct contact with the top surface of the I-type semiconductor layer IL and the side surface SINS of the second insulating layer INS2.

In an exemplary embodiment of the present invention, the uppermost surface of the sensing semiconductor layer PSEM may be disposed on the same horizontal line as the top surface of the second insulating layer INS2. For example, the uppermost surface of the sensing semiconductor layer PSEM and the top surface of the second insulating layer INS2 may be coplanar. For example, the P-type semiconductor layer PL may be disposed at the uppermost portion of the sensing semiconductor layer PSEM, and the uppermost surface HPL of the P-type semiconductor layer PL, e.g., the uppermost surface HPL of the P-type semiconductor layer PL that is most distant from the fingerprint sensor substrate FSUB, may be aligned with the top surface of the second insulating layer INS2. In an exemplary embodiment of the present invention, the uppermost surface HPL of the P-type semiconductor layer PL may be disposed on any horizontal line extending from the top surface of the second insulating layer INS2. For example, the top surface of the second insulating layer INS2 and the uppermost layer HPL of the P-type semiconductor layer PL may be disposed on the same horizontal line.

As described above, the sensing semiconductor layer PSEM including the N-type semiconductor layer NL, the I-type semiconductor layer IL, and the P-type semiconductor layer PL is disposed in the opening OP of the second insulating layer INS2, so that it is possible to prevent generation of a leakage current due to damages of the sensing semiconductor layer PSEM in a subsequent process.

The second sensing electrode PAE may be disposed on the P-type semiconductor layer PL. The second sensing electrode PAE may be made of a transparent conductive material TCO such as indium tin oxide (ITO) and indium zinc oxide (IZO) capable of transmitting light.

In an exemplary embodiment of the present invention, the second sensing electrode PAE may have substantially the same width as that of the P-type semiconductor layer PL. As shown in FIG. 6, the second sensing electrode PAE may have a width W1 in the first direction (X-axis direction), and the P-type semiconductor layer PL may have a width W2 in the first direction (X-axis direction). For example, the width W1 of the second sensing electrode PAE may be the same as the width W2 of the P-type semiconductor layer PL.

Referring to FIG. 8, in an exemplary embodiment of the present invention, the width W1 of the second sensing electrode PAE may be smaller than the width W2 of the P-type semiconductor layer PL. However, the present invention is not limited thereto, and for example, the width W1 of the second sensing electrode PAE may be greater than the width W2 of the P-type semiconductor layer PL.

In addition, a third insulating layer INS3 may be disposed on the photosensitive element PD. The third insulating layer INS3 may be formed of an inorganic layer, for example, a silicon nitride layer, a silicon oxynitride layer, a silicon oxide layer, a titanium oxide layer, or an aluminum oxide layer. The third insulating layer INS3 may include a plurality of inorganic layers.

A first connection electrode CE1 and a second connection electrode CE2 may be disposed on the third insulating layer INS3.

The first connection electrode CE1 may penetrate through the second gate insulating layer GI2, the first insulating layer INS1, the second insulating layer INS2, and the third insulating layer INS3 to be connected to the second source electrode S2 of the second thin film transistor ST2 via a source contact hole SCT that exposes the second source electrode S2 of the second thin film transistor ST2.

The second connection electrode CE2 may penetrate through the second gate insulating layer GI2, the first insulating layer INS1, the second insulating layer INS2, and the third insulating layer INS3 to be connected to the first fingerprint capacitor electrode FCE1 via a first detection contact hole RCT1 that exposes the first fingerprint capacitor electrode FCE1. The second connection electrode CE2 may penetrate through the third insulating layer INS3 to be connected to the second sensing electrode PAE via a second detection contact hole RCT2 that exposes the second sensing electrode PAE.

The first connection electrode CE1 and the second connection electrode CE2 may be formed as a single layer or multiple layers made of any one of, for example, molybdenum (Mo), aluminum (Al), chromium (Cr), gold (Au), titanium (Ti), nickel (Ni), neodymium (Nd) and copper (Cu) or an alloy thereof.

A planarization layer PLA may be disposed on the first connection electrode CE1 and the second connection electrode CE2. The planarization layer PLA may be formed of an organic layer such as acryl resin, epoxy resin, phenolic resin, polyamide resin, polyimide resin and the like.

In an exemplary embodiment of the present invention, the planarization layer PLA may include a color filter. The color filter may transmit light of a specific wavelength band. For example, the color filter may have a green color filter that transmits light of a wavelength band of about 490 nm to about 570 nm corresponding to green light. In addition, the color filter may be a cyan color filter that transmits light of a wavelength band of about 490 nm to about 570 nm and light of a wavelength band of about 450 nm to about 480 nm corresponding to blue light.

The light outputted from the display panel 100 does not include infrared light, so that the infrared light corresponds to external noise light. Therefore, it is desirable to block the infrared light. When a color filter such as a green color filter or a cyan color filter is disposed on the photosensitive element PD, the infrared light does not pass through the color filter and, thus, the infrared light incident on the photosensitive element PE) can be blocked.

In addition, the collimator layer 420 may be disposed on the photosensitive layer 410. The collimator layer 420 may include light transmissive layers LT and a light blocking layer LS.

The light transmissive layers LT may be disposed on the planarization layer PLA of the photosensitive layer 410. The light transmissive layers LT may be spaced apart from each other. The light transmissive layers LT may be arranged at a first interval in the fast direction (X-axis direction) and at a second interval in the second direction (Y-axis direction). The first interval and the second interval may be substantially the same, but the present invention is not limited thereto. For example, the light transmissive layers LT may be arranged at an interval of about 4 μm in the first direction (X-axis direction) and the second direction (Y-axis direction), but present invention is not limited thereto.

The width of the light transmissive layer LT may be about 1 μm to about 2 μm, but present invention is not limited to thereto. The width of the light transmissive layer LT may be the length of the light transmissive layer LT in the first direction (X-axis direction) or the second direction (Y-axis direction). The length of the light transmissive layer LT in the third direction (Z-axis direction) may be several micrometer. For example, the length of the light transmissive layer LT in the third direction (Z-axis direction) may be 5 μm or more. For example, the light transmissive layer LT may have a polygonal columnar shape such as a cylindrical shape, an elliptical columnar shape or a square columnar shape.

The light transmissive layer LT may be formed of an organic layer such as acryl resin, epoxy resin, phenolic resin, polyamide resin, polyimide resin and the like.

The light blocking layer LS may be disposed between the light transmissive layers LT. The light blocking layer LS may be disposed between the light transmissive layers LT adjacent to each other in the first direction (X-axis direction). In addition, the light blocking layer LS may be disposed between the light transmissive layers LT adjacent to each other in the second direction (Y-axis direction). The light transmissive layers LT may be at least partially surrounded by the light blocking layers LS.

The width of the light blocking layer LS may be about 1 μm to about 1.5 μm, but present invention is not limited thereto. The width of the light blocking layer LS may extend in the first direction (X axis direction) or in the second/direction (Y axis direction). The light blocking layer LS may be made of a photosensitive resin capable of blocking light. For example, the light blocking layer LS may include an organic block pigment or an inorganic black pigment such as carbon black or the like.

Each of the openings OA of the collimator layer 420 may be an area where the light blocking layer LS is not disposed, and the light blocking portion LSA may be an area where the light blocking layer LS is disposed. The light transmissive layer LT may be disposed in each of the openings OA. The photosensitive element PD overlaps the openings OA in the third direction (Z-axis direction), so that light can be incident on the photosensitive element PD of the sensor pixel SP through the openings OA.

A transparent adhesive member 430 may be disposed on the collimator layer 420. The transparent adhesive member 430 may be attached to the top surface of the collimator layer 420 and the bottom surface of the display panel 100. The refractive index of the transparent adhesive member 430 may be higher than that of the light transmissive film LT.

Figure 9:
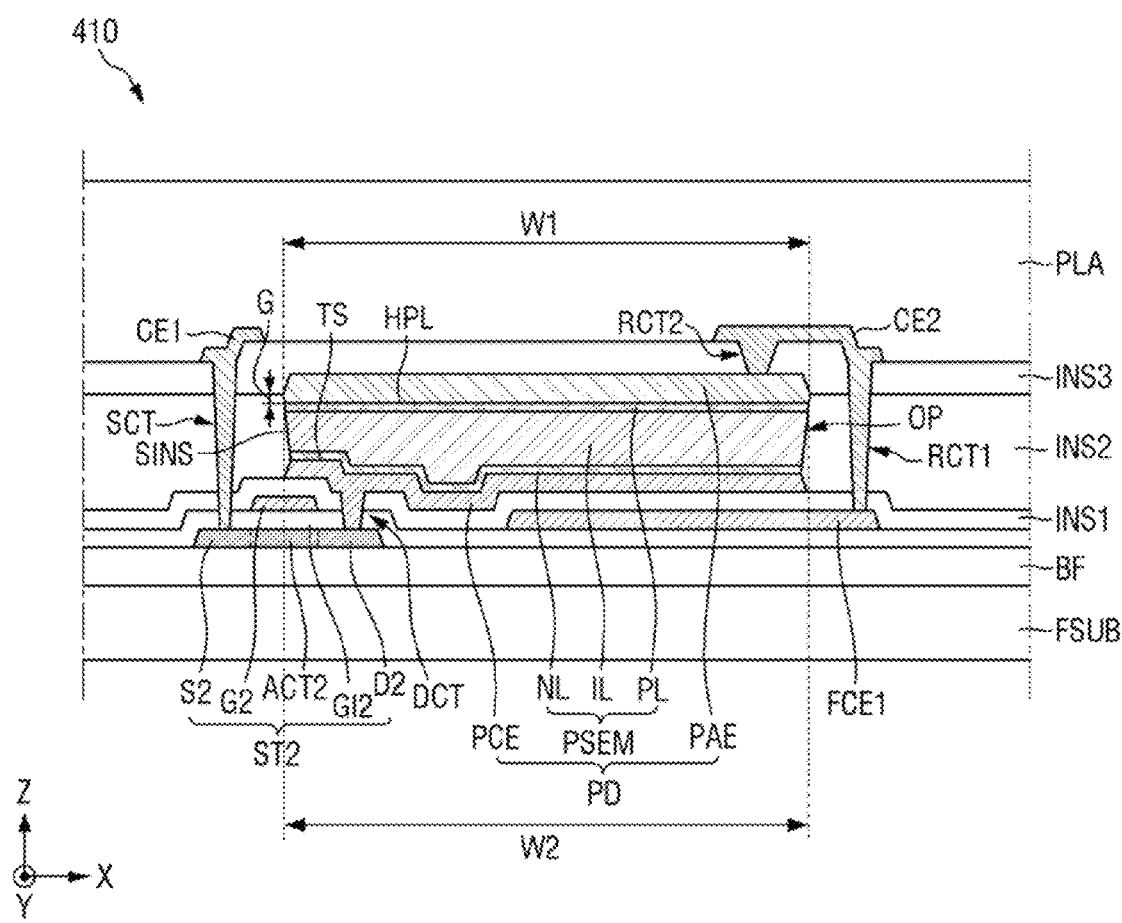
FIG. 9 is an enlarged cross-sectional view illustrating the fingerprint sensor in area A of FIG. 3.

FIG. 9 is an enlarged cross-sectional view illustrating the fingerprint sensor in area A of FIG. 3.

The embodiment of FIG. 9 is different from the embodiment of FIG. 5 in that the P-type semiconductor layer PL of the sensing semiconductor layer PSEM is recessed compared to the top surface of the second insulating layer INS2. The differences between the configuration of the embodiment of FIG. 9 and the configuration of the embodiment of FIG. 5 will be mainly described, and descriptions of elements that are similar between FIGS. 5 and 9 may be omitted.

Referring to FIG. 9, the sensing semiconductor layer PSEM may be disposed in the opening OP of the second insulating layer INS2. The sensing semiconductor layer PSEM may include the N-type semiconductor layer NL, the I-type semiconductor layer IL, and the P-type semiconductor layer PL.

In an exemplary embodiment of the present invention, the uppermost surface HPL of the P-type semiconductor layer PL, e.g., the uppermost surface HPL of the P-type semiconductor layer PL that is must distant from the fingerprint sensor substrate FSUB, may be spaced apart from the top surface of the second insulating layer INS2. In an exemplary embodiment of the present invention, the uppermost surface HPL of the P-type semiconductor layer PL may be closer to the fingerprint sensor substrate FSUB compared to the top surface of the second insulating layer INS2. For example, the uppermost surface HPL of the P-type semiconductor layer PL may be recessed toward the fingerprint sensor substrate FSUB compared to the top surface of the second insulating layer INS2. For example, the uppermost surface HPL of the P-type semiconductor layer PL may be disposed below the top surface of the second insulating layer INS2.

For example, the uppermost surface HPL of the P-type semiconductor layer PL may be spaced apart from the top surface of the second insulating layer INS2 by a predetermined gap G toward the fingerprint sensor substrate FSUB. In the case of polishing the P-type semiconductor layer PL by an entire surface polishing process in the manufacturing process to be described later, the P-type semiconductor layer PL may be polished depending on a polishing rate. Therefore, the uppermost surface HPL of the P-type semiconductor layer PL may be spaced apart from the top surface of the second insulating layer INS2 by the predetermined gap G toward the fingerprint sensor substrate FSUB.

Further, in an exemplary embodiment of the present invention, the second sensing electrode PAE may be partially disposed in the opening OP of the second insulating layer INS2. The bottom surface of the second sensing electrode PAE may be disposed closer to the fingerprint sensor substrate FSUB compared to the top surface of the second insulating layer INS2. For example, the bottom surface of the second sensing electrode PAE may be disposed below the top surface of the second insulating layer INS2.

Further, in an exemplary embodiment of the present invention, the width W1 of the second sensing electrode PAE may be greater than the width W2 of the P-type semiconductor layer PL. The side surface SINS in the opening OP of the second insulating layer INS2 has a positive taper with respect to the top surface TS of the first sensing electrode PCE, so that the width of the P-type semiconductor layer PL disposed below the second sensing electrode PAE may be reduced. Therefore, the width W1 of the second sensing electrode PAE may be greater than the width W2 of the P-type semiconductor layer PL. However, the present invention is not limited thereto, and for example, the width W1 of the second sensing electrode PAE may be smaller than the width W2 of the P-type semiconductor layer PL as shown in FIG. 8.

As shown in FIG. 7, the side surface SINS of the second insulating layer INS2 in the opening OP may have a reverse taper with respect to the top surface TS of the first sensing electrode PCE.

Figure 10:
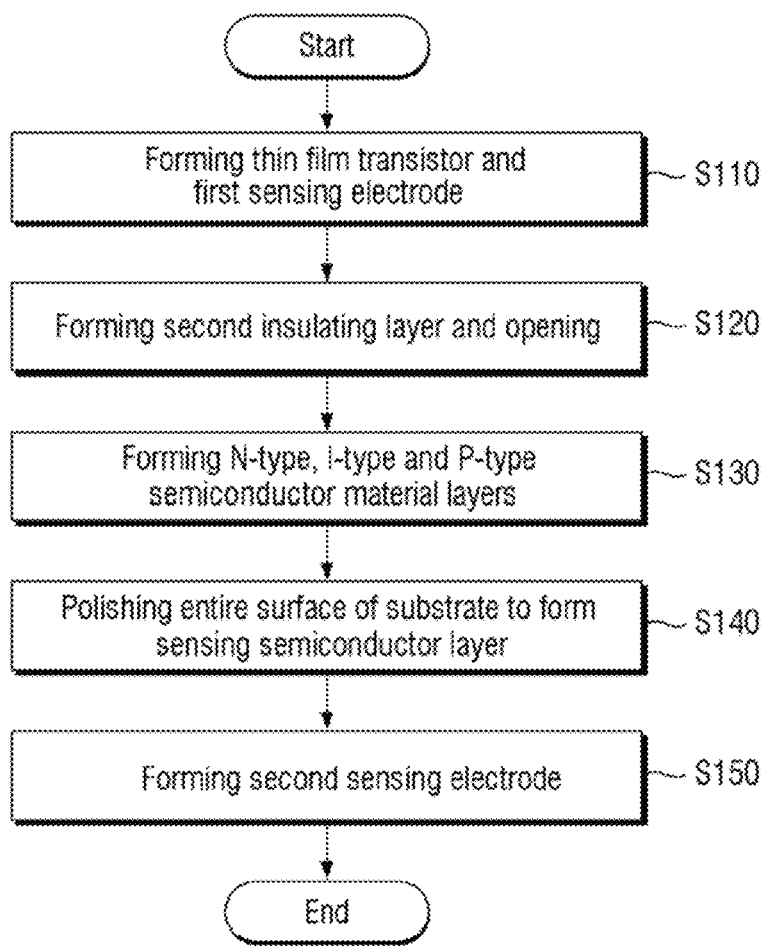
FIG. 10 is a flowchart showing a method for manufacturing a fingerprint sensor according to an exemplary embodiment of the present invention.

FIG. 10 is a flowchart showing a method for manufacturing a fingerprint sensor according to an exemplary embodiment of the present invention. FIGS. 11 to 17 are views illustrating the method for manufacturing the fingerprint sensor of FIG. 10 according to an exemplary embodiment of the present invention.

Hereinafter, a method for manufacturing the fingerprint sensor according to an exemplary embodiment shown in FIGS. 11 to 17 will be described in detail together with FIG. 10.

First, the second thin film transistor ST2 and the first sensing electrode PCE are formed (step S110 in FIG. 10).

Figure 11:
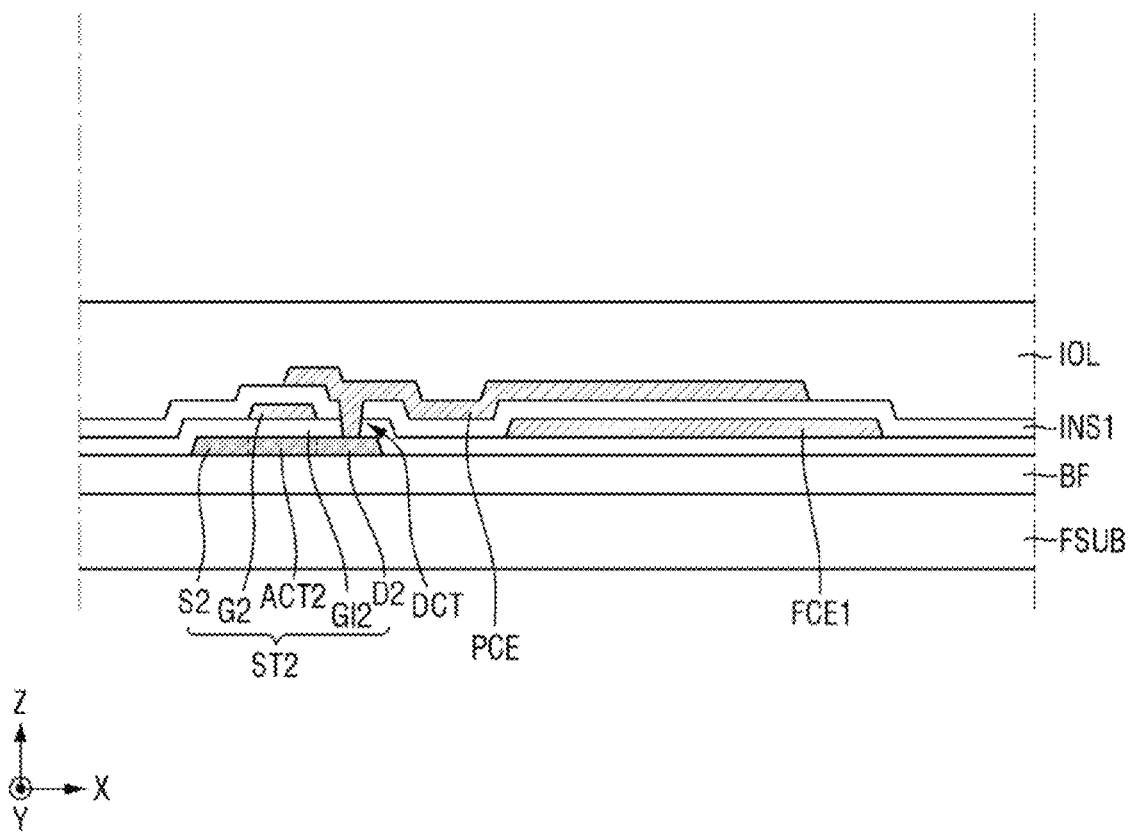
FIGS. 11, 12, 13, 14, 15, 16 and 17 are views illustrating the method for manufacturing the fingerprint sensor of FIG. 10 according to an exemplary embodiment of the present invention.

Referring to FIG. 11, an inorganic material is deposited on a fingerprint sensor substrate FSUB to form a buffer layer BF. A second active layer ACT2 of a second thin film transistor ST2 is formed on the buffer layer BF using a photolithography process. An inorganic material is deposited on the second active layer ACT2 of the second thin film transistor ST2 to form a second gate insulating layer GI2.

Then, a second gate electrode G2 of the second thin film transistor ST2 and a first fingerprint capacitor electrode FCE1 are formed on the second gate insulating layer GI2 using a photolithography process. Further, a second source electrode S2 and a second drain electrode D2 are formed by doping the second active layer ACT2 of the second thin film transistor ST2 with impurities or ions while using the second gate electrode G2 as a mask.

Then, an inorganic material is deposited on the second gate electrode G2 of the second thin film transistor ST2 and the first fingerprint capacitor electrode FCE1 to form a first insulating layer INS1. Then, the second gate insulating layer GI2 and the first insulating layer INS1 are etched using a photolithography process to form a drain contact hole DCT that exposes the second drain electrode D2 of the second thin film transistor ST2.

Then, a first sensing electrode PCE of a photosensitive element PD is formed on the first insulating layer INS1 using a photolithography process.

Then, a second insulating layer INS2 is formed on the first insulating layer INS1, and an opening OP is formed in the second insulating layer INS2 (step S120 in FIG. 10).

Referring to FIG. 11, an inorganic layer IOL is formed on the fingerprint sensor substrate FSUB having the first sensing electrode PCE. For example, silicon nitride (SiNx) is deposited as the inorganic layer IOL.

Figure 12:
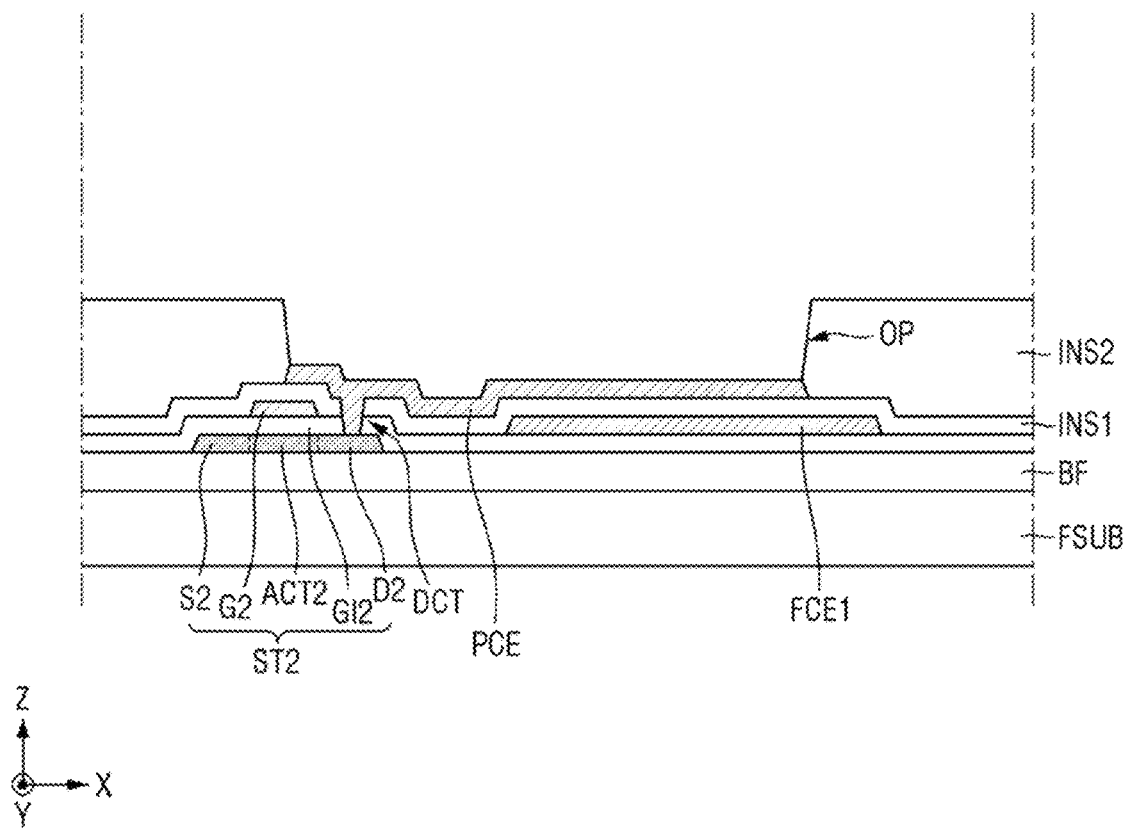

Next, referring to FIG. 12, the inorganic layer 101, is etched using a photolithography process to form an opening OP that exposes the first sensing electrode PCE. Accordingly, the second insulating layer INS2 having the opening OP is formed.

Then, an N-type semiconductor material layer NNL, an I-type semiconductor material layer IIL, and a P-type semiconductor material layer PPL are formed (step S130 in FIG. 10).

Figure 13:
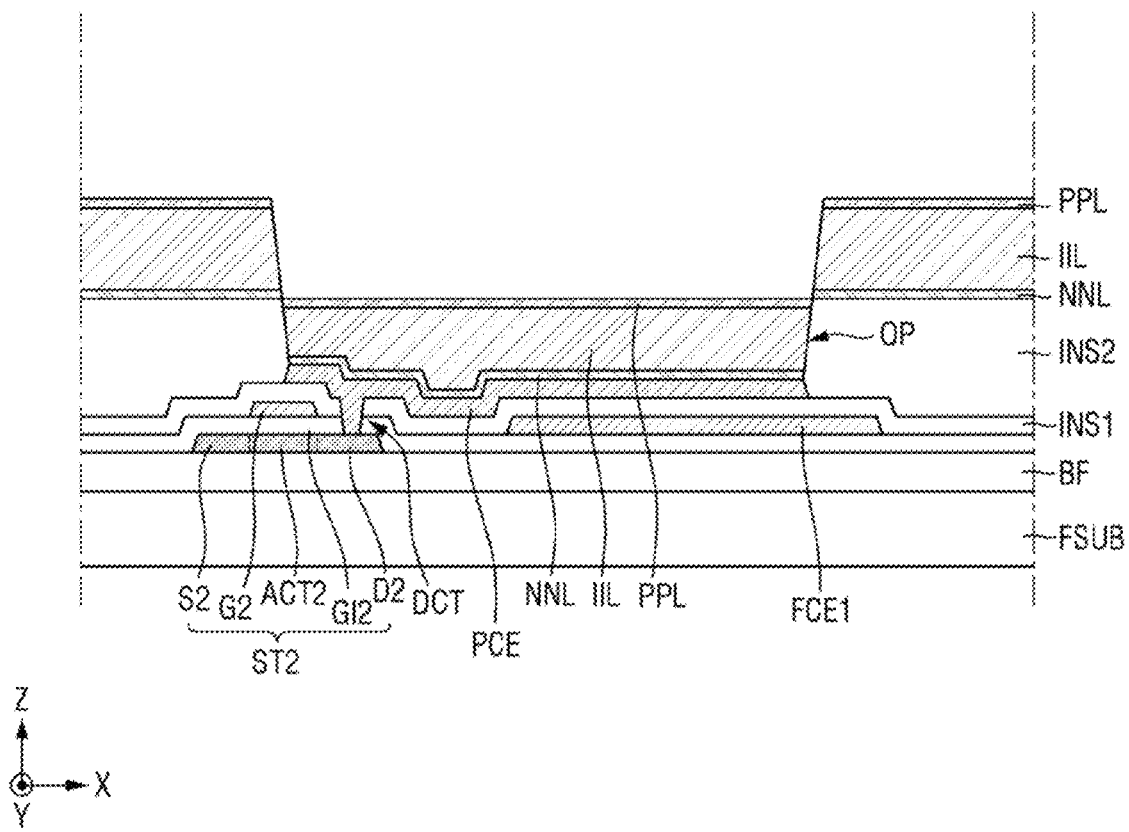

Referring to FIG. 13, the N-type semiconductor material layer NNL, the I-type semiconductor material layer IIL, and the P-type semiconductor material layer PPL are stacked in that order on the fingerprint sensor substrate FSUB having the second insulating layer INS2. For example, the N-type semiconductor material layer NNL, the I-type semiconductor material layer IIL, and the P-type semiconductor material layer PPL are stacked by a continuous vapor deposition process. For example, the N-type semiconductor material layer NNL, the I-type semiconductor material layer IIL, and the P-type semiconductor material layer PPL may be formed using different reactant gases by different vapor deposition devices under the same chamber atmosphere. At this time, the N-type semiconductor material layer NNL has a thickness of several tens of nanometers, which is thin, and thus is not substantially deposited on the side surface of the second insulating layer INS2.

Then, the entire surface of the fingerprint sensor substrate FSUB is polished to n a sensing semiconductor layer PSEM (step S140 in FIG. 10).

Figure 14:
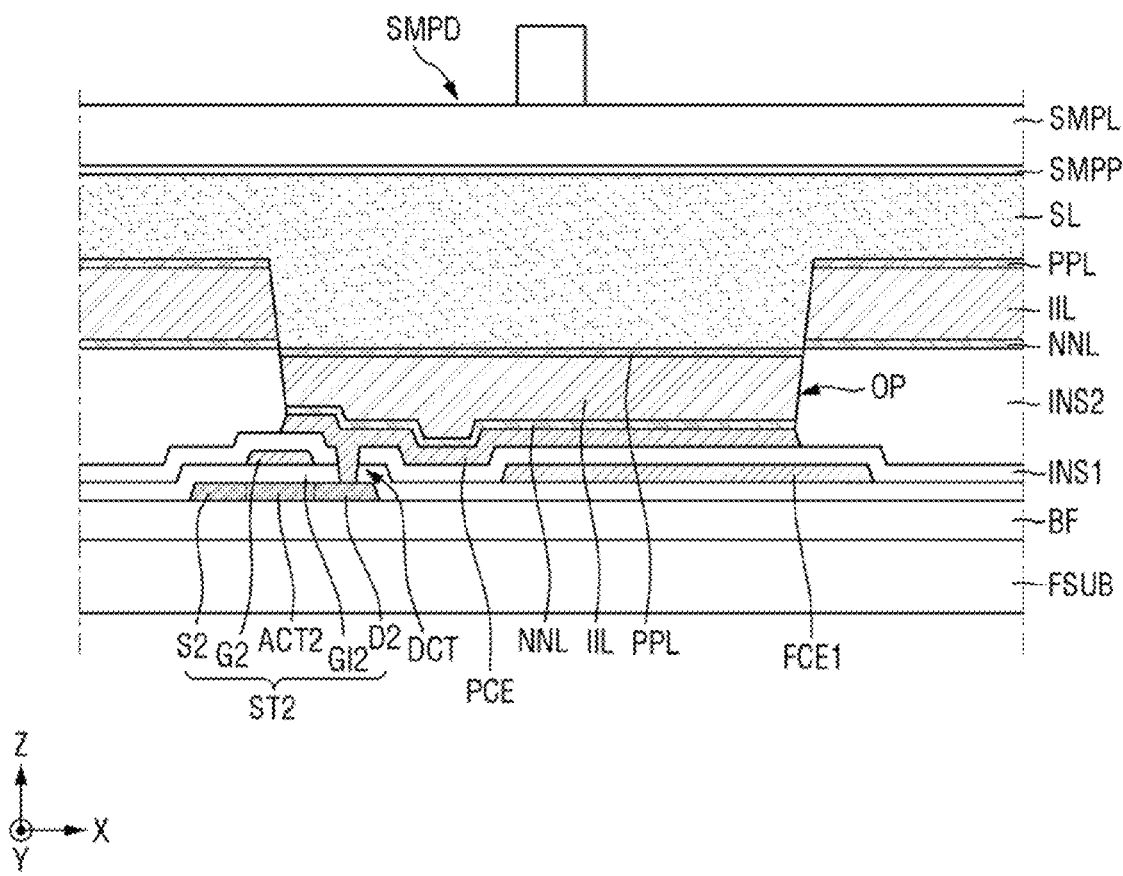
Figure 15:
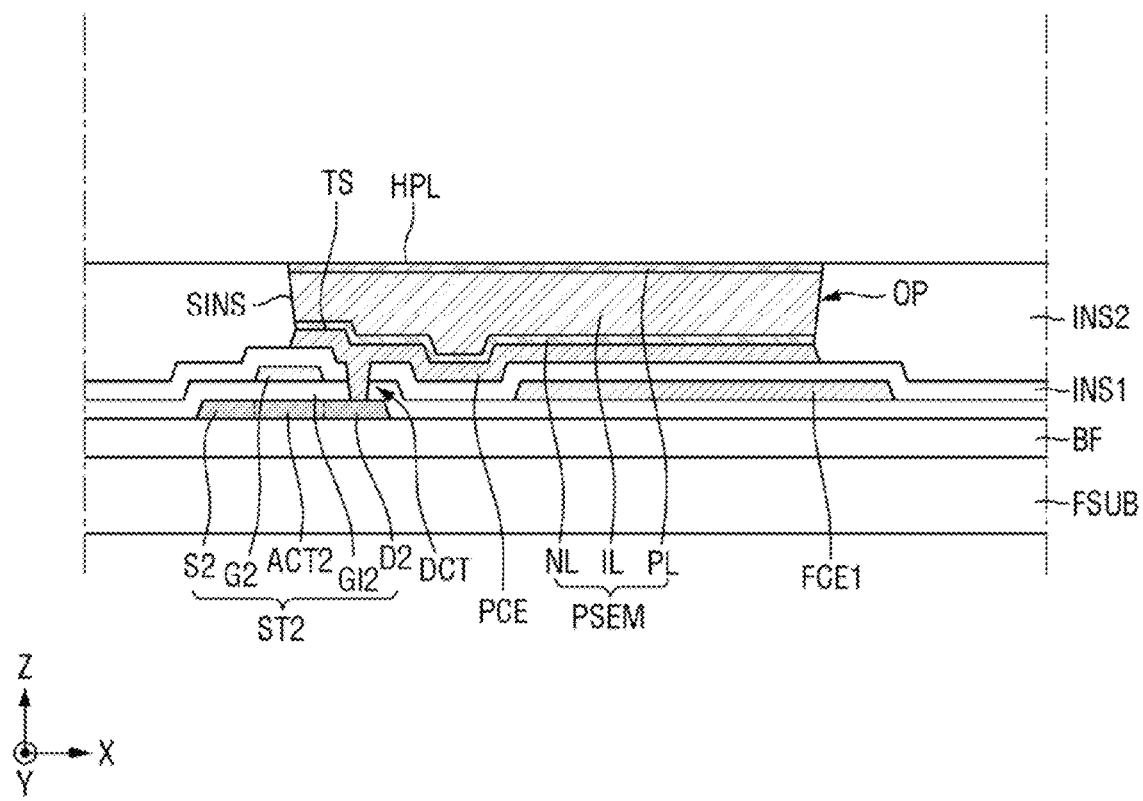

Referring to FIGS. 14 and 15, the entire surface of the fingerprint sensor substrate FSUB having the N-type semiconductor material layer NNL, the I-type semiconductor material layer IIL and the P-type semiconductor material layer PPL is polished. The polishing process may be performed using, for example, a polishing device for performing chemical mechanical polishing (CMP).

In the CMP process, the polishing is performed in such a manner that polishing slurry is adsorbed onto a surface of a substrate and falls due to fluidity while holding a partial region of the surface of the substrate. Therefore, when the electrical characteristics of the substrate surface and the polishing slurry are opposite to each other at the pH of the polishing slurry, an attractive force is generated, which makes the polishing easier and increases a removal rate (RR). By utilizing the characteristics that a layer to be removed by polishing and a layer that is not desired to be polished have different polarities, it is possible to realize a self-stop process in which etching proceeds and stops at a layer that is not desired to be polished.

The polishing device SMPD includes a polishing unit SMPL equipped with a polishing pad SMPP. The polishing device SMPD polishes a target by rotation or linear reciprocating motion of the polishing unit SMPL. At this time, the polishing slurry SL is supplied to a gap between the polishing pad SMPP and the fingerprint sensor substrate FSUB through a nozzle or the like.

In FIG. 14, the polishing targets are the N-type semiconductor material layer NNL, the I-type semiconductor material layer IIL, and the P-type semiconductor material layer PPL disposed on the top surface of the second insulating layer INS2. For example, by applying the polishing slurry SL on the fingerprint sensor substrate FSUB and polishing the N-type semiconductor material layer NNL, the I-type semiconductor material layer IIL, and the P-type semiconductor material layer PPL using the polishing device SMPD, the sensing semiconductor layer PSEM including the N-type semiconductor layer NL, the I-type semiconductor layer IL, and the P-type semiconductor layer PL is formed as shown in FIG. 14. Further, the fingerprint sensor substrate FSUB has the P-type semiconductor material layer PPL.

By performing the polishing process, the top surface of the second insulating layer INS2 and the uppermost surface of the P-type semiconductor layer PL can be disposed on the same horizontal line and aligned with each other. In an exemplary embodiment of the present invention, the uppermost surface of the P-type semiconductor layer PL may be recessed toward the fingerprint sensor substrate FSUB compared to the top surface of the second insulating layer INS2 as shown in FIG. 9 by further polishing the P-type semiconductor layer PL in the polishing process.

In an exemplary embodiment of the present invention, the sensing semiconductor layer PSEM is not necessarily formed by the entire surface polishing process. The sensing semiconductor layer PSEM may be formed by forming a mask pattern on the second insulating layer INS2, and stacking the N-type semiconductor material layer, the I-type semiconductor material layer, and the P-type semiconductor material layer thereon. Then, the mask pattern may be lifted off.

Then, a second sensing electrode PAE, is formed (step S150 in FIG. 10).

Figure 16:
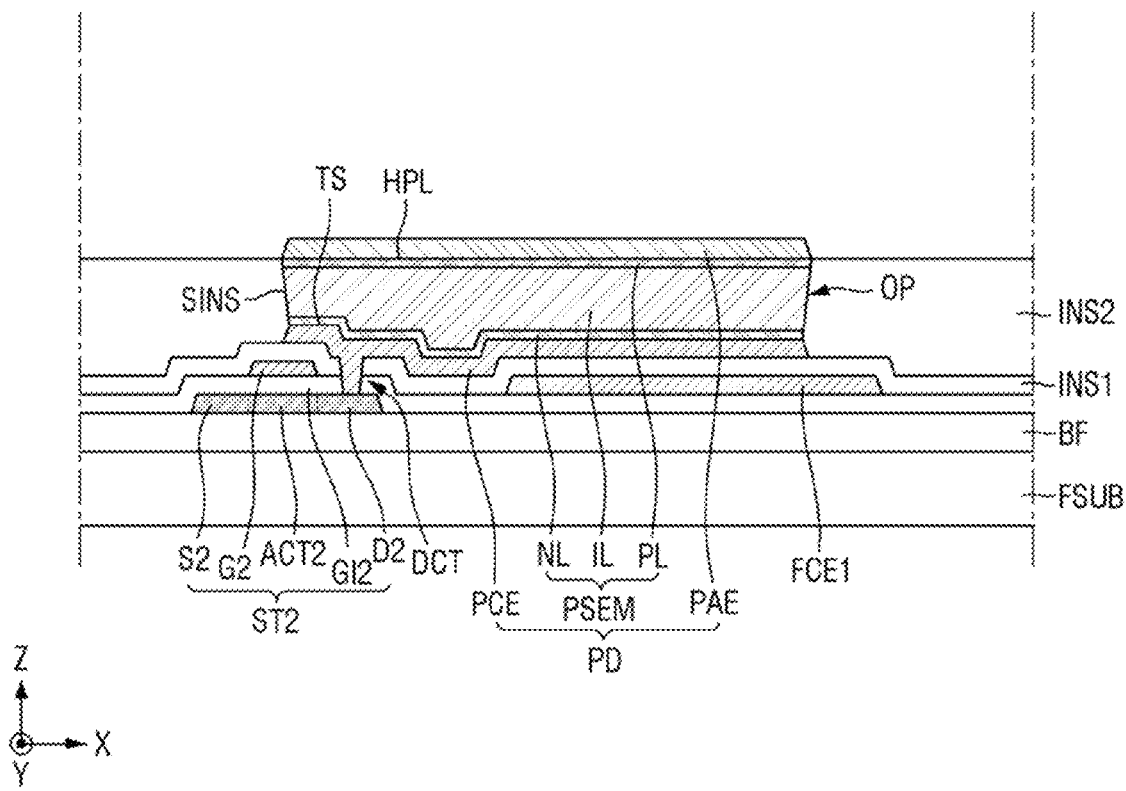

Referring to FIG. 16, the second sensing electrode PAE, is formed on the fingerprint sensor substrate FSUB having the sensing semiconductor layer PSEM using a photolithography process. Accordingly, the photosensitive element PD including the first sensing electrode PCE, the sensing semiconductor layer PSEM, and the second sensing electrode PAE can be formed.

Figure 17:
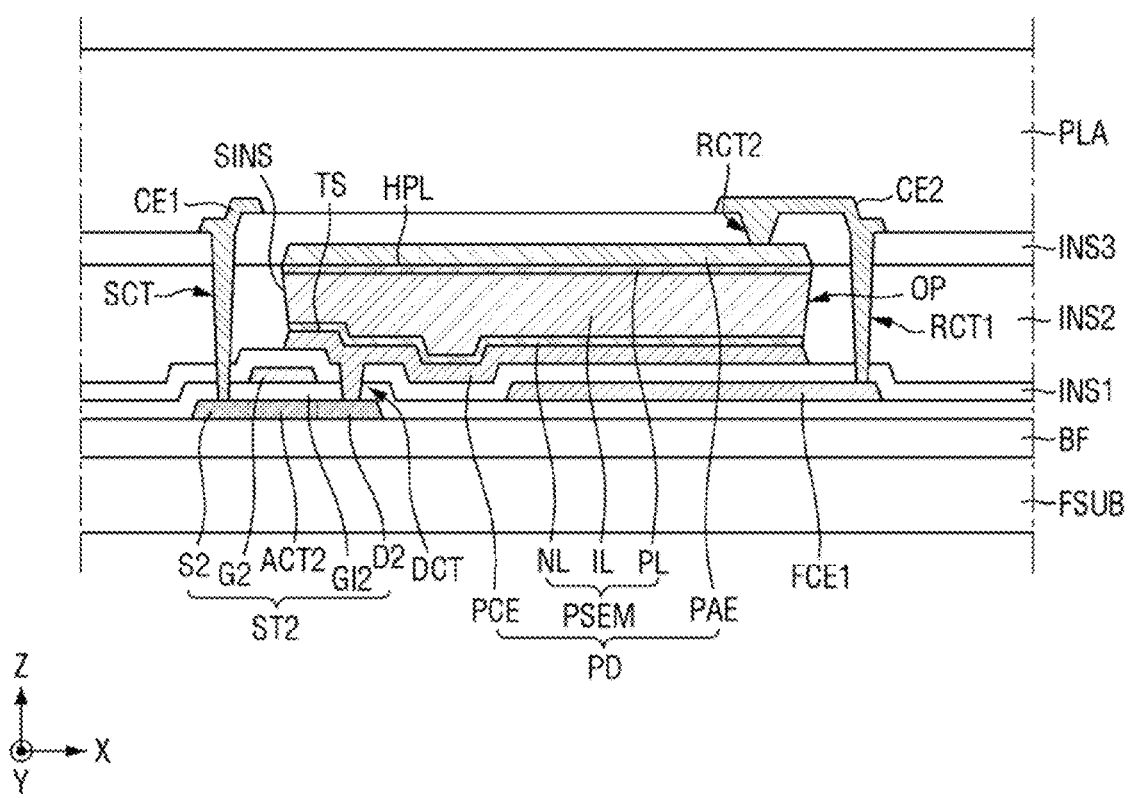

Next, referring to FIG. 17, an inorganic material is deposited on the photosensitive element PD to form a third insulating layer INS3. A source contact hole SCT, a drain contact hole DCT, a first detection contact hole RCT1, and a second detection contact hole RCT2 are formed in the third insulating layer INS3 by a photolithography process. The source contact hole SCT may be formed by etching the second gate insulating layer GI2, the first insulating layer INS1, the second insulating layer INS2, and the third insulating layer INS3. The drain contact hole DCT may be formed by etching the second gate insulating layer GI2 and the first insulating layer INS1. The first detection contact hole RCT1 may be formed by etching the first insulating layer INS1, the second insulating layer INS2, and the third insulating layer INS3. The second detection contact hole RCT2 may be formed by etching the third insulating layer INS3.

Then, a first connection electrode CE1 and a second connection electrode CE2 are formed on the third insulating layer INS3 by a photolithography process. For example, a conductive material may be disposed on the third insulating layer INS3 to form the first connection electrode CE1 and the second connection electrode CE2. The first connection electrode CE1 may be connected to the second source electrode S2 of the second thin film transistor ST2 via the source contact hole SCT. The second connection electrode CE2 may be connected to the first detection capacitor electrode FCE1 via the first detection contact hole RCT1. Further, the second connection electrode CE2 may be connected to the second sensing electrode PAE via the second detection contact hole RCT2.

Then, an organic material is deposited on the first connection electrode CE1 and the second connection electrode CE2 to form a planarization layer PLA. Accordingly, the sensor according to an exemplary embodiment of the present invention can be manufactured.

As shown in FIGS. 10 to 17, the opening, OP may be formed in the second insulating layer INS2, and the sensing semiconductor layer PSEM including the N-type semiconductor layer NL, the I-type semiconductor layer IL, and the P-type semiconductor layer PL may be formed in the opening OP. Accordingly, the side surface of the sensing semiconductor layer PSEM is protected by the second insulating layer INS2 which makes it possible to prevent a generation of a leakage current due to damage to the side surface of the sensing semiconductor layer PSEM in subsequent processes.

FIGS. 18 to 22 are views illustrating a method for manufacturing the fingerprint sensor of FIG. 9 according to an exemplary embodiment of the present invention. Since the steps up to FIG. 12 are the same, the description thereof may be omitted, and the subsequent steps of the manufacturing method will be described.

Figure 18:
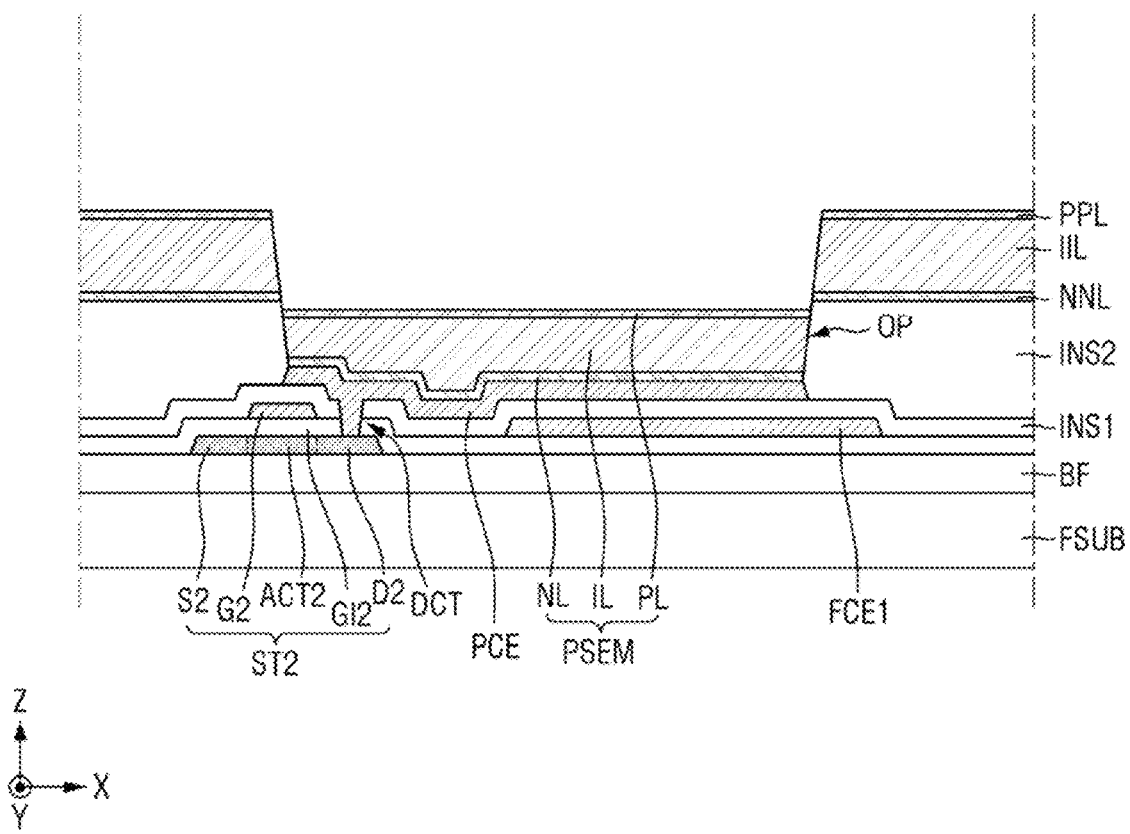
FIGS. 18, 19, 20, 21 and 22 are views illustrating a method for manufacturing the fingerprint sensor of FIG. 9 according to an exemplary embodiment of the present invention.

Referring to FIG. 18, an N-type semiconductor material layer NNL, I-type semiconductor material layer IIL, and a P-type semiconductor material layer PPL are stacked in that order on the fingerprint sensor substrate FSUB having the second insulating layer INS2. The N-type semiconductor material layer NNL, the I-type semiconductor material layer IIL, and the P-type semiconductor material layer PPL are stacked by a continuous vapor deposition process. In the present embodiment unlike the case shown in FIG. 13, the N-type semiconductor material layer NNL, the I-type semiconductor material layer IIL, and the P-type semiconductor material layer PPL may have different thicknesses. For example, the thickness of the I-type semiconductor material layer IIL may be relatively small. In this case, the top surface of the P-type semiconductor material layer PPL may be disposed closer to the fingerprint sensor substrate FSUB compared to the top surface of the second insulating layer INS2.

Figure 19:
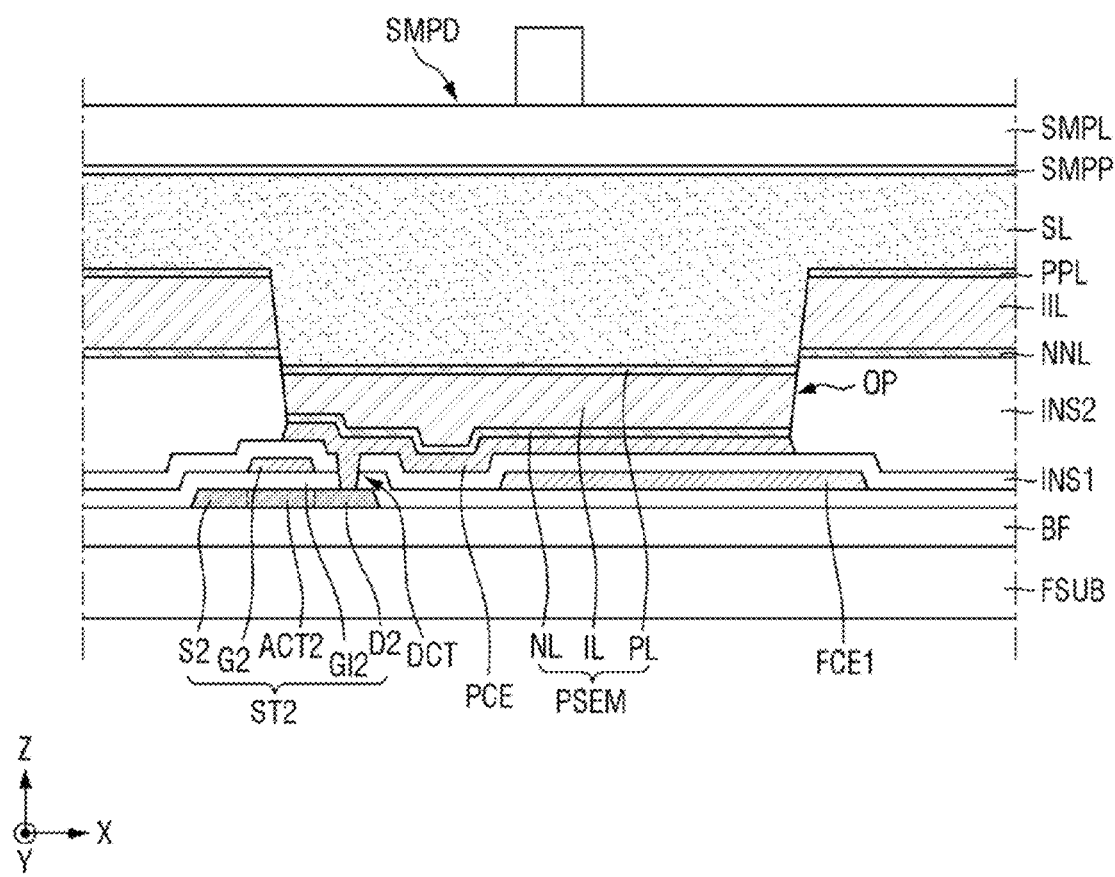
Figure 20:
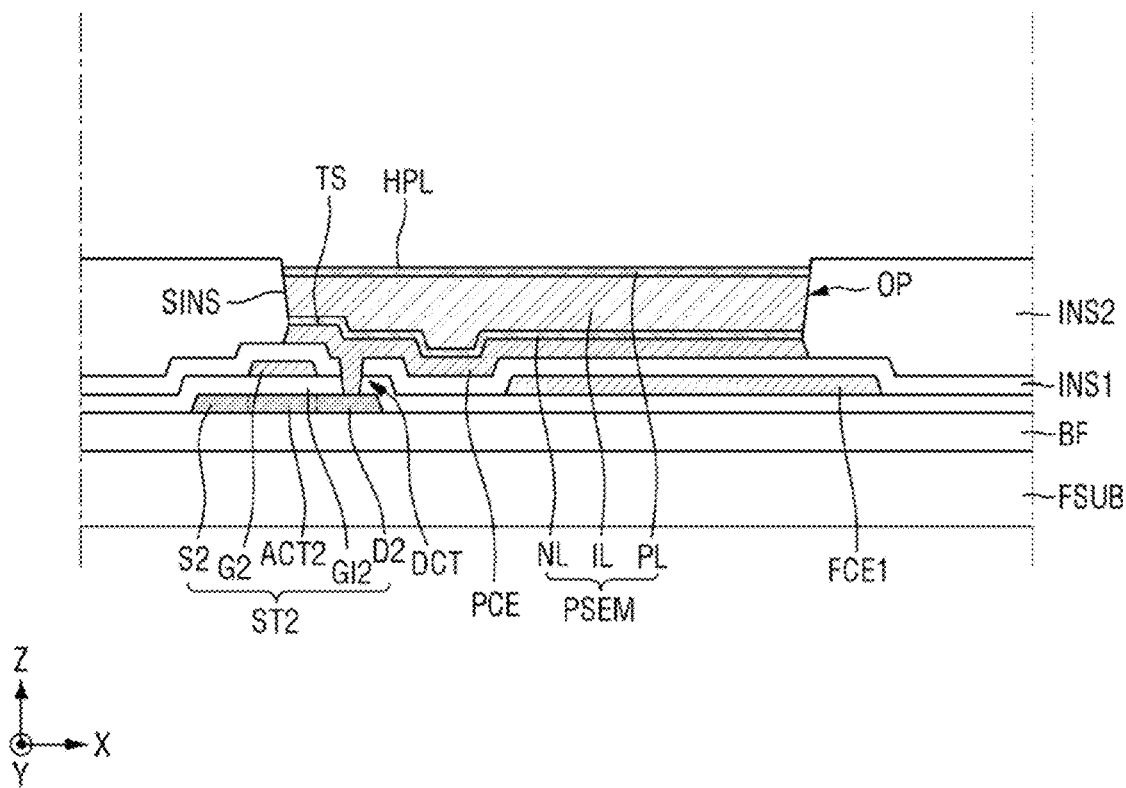

Next, referring to FIGS. 19 and 20, the entire surface of the fingerprint sensor substrate FSUB including the N-type semiconductor material layer NNL, the I-type semiconductor material layer IIL, and the P-type semiconductor material layer PPL is polished using a chemical mechanical polishing process. By polishing, the N-type semiconductor material layer NNL, the I-type semiconductor material layer IIL, and the P-type semiconductor material layer PPL using the polishing device SMPD the sensing semiconductor layer PSEM including the N-type semiconductor layer NL, the I-type semiconductor layer IL, and the P-type semiconductor layer PL is formed as shown in FIG. 20. By performing the polishing process, the uppermost surface of the P-type semiconductor layer PL can be recessed toward the fingerprint sensor substrate FSUB compared to the top surface of the second insulating layer INS2. For example, the uppermost surface of the P-type semiconductor layer PL may be formed below the top surface of the second insulating layer INS2. For example, the uppermost surface of the P-type semiconductor layer PL may be disposed closer to the fingerprint sensor substrate FSUB compared to the top surface of the second insulating layer INS2.

Figure 21:
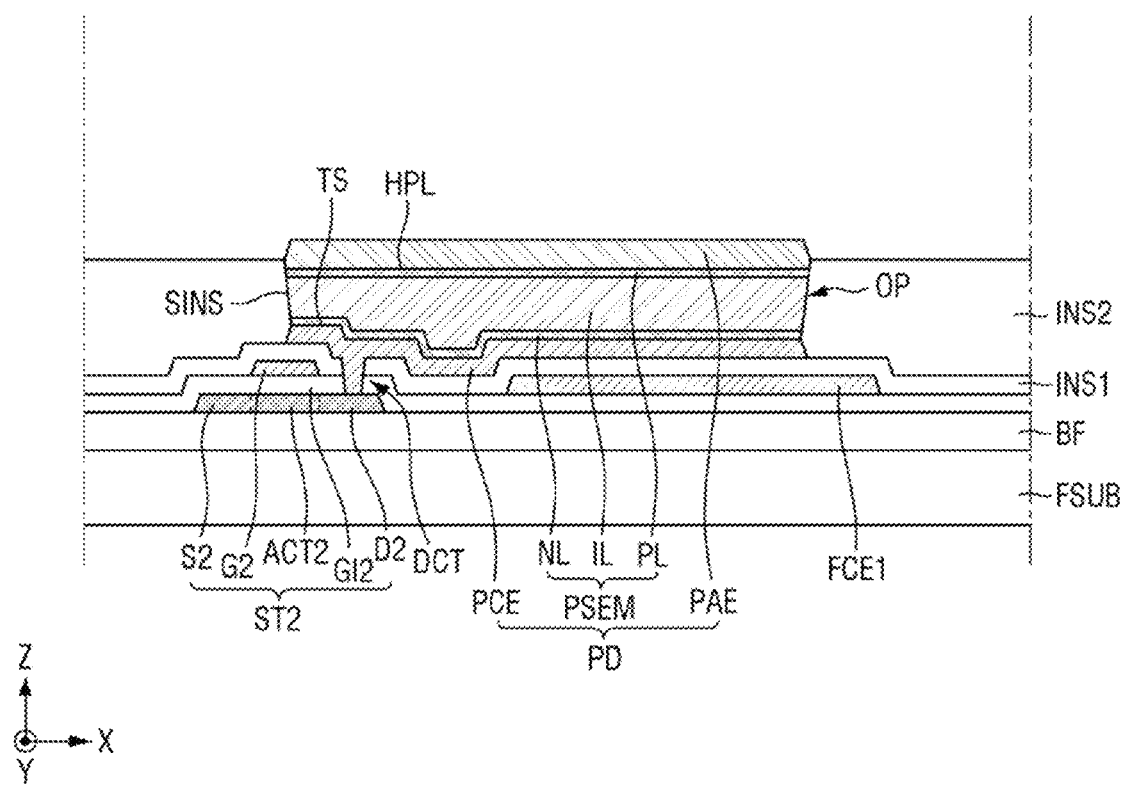

Next, referring to FIG. 21, a second sensing electrode PAE is formed on the fingerprint sensor substrate FSUB having the sensing semiconductor layer PSEM. Accordingly, the photosensitive element PD including the first sensing electrode PCE, the sensing semiconductor layer PSEM, and the second sensing electrode PAE can be formed.

Figure 22:
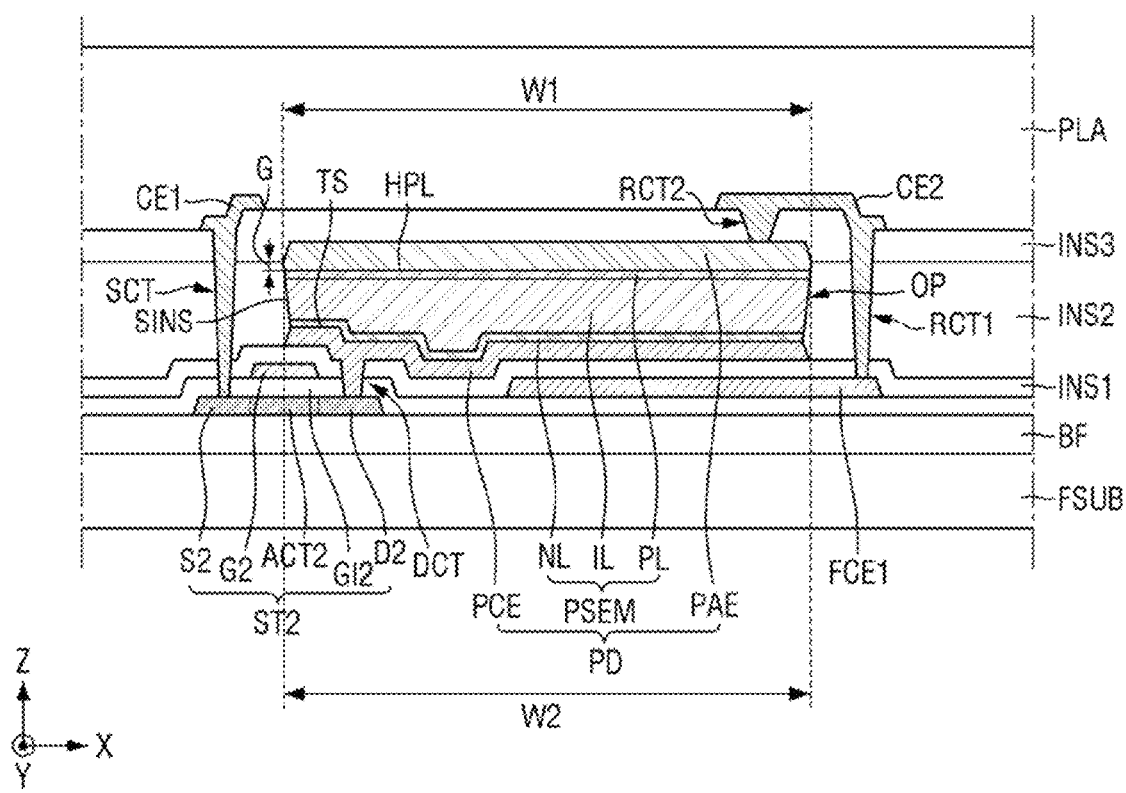

Next, referring to FIG. 22, a third insulating layer INS3 is formed on the photosensitive element PD, and a source contact hole SCT, a drain contact hole DCT, a first detection contact hole RCT1, and a second detection contact hole RCT2 are formed in the third insulating layer INS3. Then, a first connection electrode CE1 and a second connection electrode CE2 are formed on the third insulating layer INS3. The first connection electrode CE1 may be connected to the second source electrode S2 of the second thin film transistor ST2 via the source contact hole SCT. The second connection electrode CE2 may be connected to the first detection capacitor electrode FCE1 via the first detection contact hole RCT1. Further, the second connection electrode CE2 may be connected to the second sensing electrode PAE via the second detection contact hole RCT2.

Then, an organic material is deposited on the first connection electrode CE1 and the second connection electrode CE2 to form a planarization layer PLA. Accordingly, the sensor according to an exemplary embodiment of the present invention can be manufactured. In the present embodiment, as described above with reference to FIG. 9, the bottom surface of the second sensing electrode PAE may be closer to the fingerprint sensor substrate FSUB compared to the top surface of the second insulating layer INS2. Further, the width W1 of the second sensing electrode PAE may be greater than the width W2 of the P-type semiconductor layer PL.

While the present invention has been described with reference to the exemplary embodiments thereof, it will be understood by those of ordinary skill in the art that various changes in form and detail may be made thereto without departing from the spirit and scope of the present invention.

What is claimed is:

1. A fingerprint sensor comprising:
   a thin film transistor disposed on a substrate;
   a first insulating layer disposed on the thin film transistor;
   a first sensing electrode disposed on the first insulating layer and connected to the thin film transistor;
   a second insulating layer disposed on the first sensing electrode and including an opening exposing the first sensing electrode;
   a sensing semiconductor layer disposed in the opening of the second insulating layer and on the first sensing electrode, and including an N-type semiconductor layer, an I-type semiconductor layer, and a P-type semiconductor layer;

a second sensing electrode disposed on the sensing semiconductor layer;

a first fingerprint capacitor electrode electrically connected to the second sensing electrode;

a first connection electrode connected to the thin film transistor, and extending in a vertical direction with respect to an upper surface of the substrate to cover a first side surface of the sensing semiconductor layer; and a second connection electrode connected to the first fingerprint capacitor electrode and the second sensing electrode, and extending in the vertical direction with respect to the upper surface of the substrate to cover a second side surface, opposite to the first side surface, of the sensing semiconductor layer, wherein the first sensing electrode overlaps the first fingerprint capacitor electrode, wherein a width of the sensing semiconductor layer gradually decreases as it approaches the substrate in a first direction, and wherein a width of the second sensing electrode is smaller than a width of a top surface of the P-type semiconductor layer.

2. The fingerprint sensor of claim 1, wherein a width of the opening gradually decreases as it approaches the substrate.

3. The fingerprint sensor of claim 1, wherein the I-type semiconductor layer is disposed on the N-type semiconductor layer, and the P-type semiconductor layer is disposed on the I-type semiconductor layer.

4. The fingerprint sensor of claim 3, wherein an upper surface of the P-type semiconductor layer and the upper surface of the second insulating layer are coplanar.

5. The fingerprint sensor of claim 1, wherein the second sensing electrode protrudes in a direction away from the substrate from the upper surface of the second insulating layer.

6. The fingerprint sensor of claim 1, wherein a bottom surface of the second sensing electrode and the upper surface of the second insulating layer are coplanar.

7. The display device of claim 1, wherein an upper surface of the sensing semiconductor layer and an upper surface of the second insulating layer are coplanar.

* * * * *